(12) United States Patent
Razazian et al.

(10) Patent No.: US 8,276,025 B2
(45) Date of Patent: Sep. 25, 2012

(54) BLOCK INTERLEAVING SCHEME WITH CONFIGURABLE SIZE TO ACHIEVE TIME AND FREQUENCY DIVERSITY

(75) Inventors: Kaveh Razazian, Aliso Viejo, CA (US); Amir Hosein Kamalizad, Irvine, CA (US); Maher Umari, Irvine, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 619 days.

(21) Appl. No.: 12/478,679

(22) Filed: Jun. 4, 2009

(65) Prior Publication Data

US 2009/0307541 A1    Dec. 10, 2009

Related U.S. Application Data

(60) Provisional application No. 61/059,707, filed on Jun. 6, 2008.

(51) Int. Cl.
*G06F 11/00* (2006.01)
(52) U.S. Cl. ........................................................ 714/701
(58) Field of Classification Search ........................ None
See application file for complete search history.

(56) References Cited

U.S. PATENT DOCUMENTS

| | | | |
|---|---|---|---|
| 5,768,305 A | 6/1998 | Kanda | |
| 5,841,385 A | 11/1998 | Xie | |
| 6,347,234 B1 | 2/2002 | Scherzer | |
| 6,415,004 B1 | 7/2002 | Fujimura et al. | |
| 6,614,864 B1 | 9/2003 | Raphaeli et al. | |
| 6,727,790 B2 | 4/2004 | Raphaeli et al. | |
| 6,799,193 B2 | 9/2004 | Kilani et al. | |
| 6,888,790 B2 | 5/2005 | Kilani | |
| 6,976,044 B1 | 12/2005 | Kilani | |
| 6,983,011 B1 | 1/2006 | Hara et al. | |
| 7,020,095 B2 | 3/2006 | Chini et al. | |
| 7,167,456 B2 | 1/2007 | Iwamatsu et al. | |
| 7,430,193 B2 | 9/2008 | Kim et al. | |
| 7,433,425 B1 | 10/2008 | Lou et al. | |
| 7,634,034 B2 | 12/2009 | Larsson | |
| 2002/0051499 A1 | 5/2002 | Cameron et al. | |
| 2002/0105901 A1 | 8/2002 | Chini et al. | |
| 2002/0188908 A1 | 12/2002 | Yonge, III et al. | |
| 2003/0235254 A1 | 12/2003 | Fanson et al. | |
| 2004/0062326 A1 | 4/2004 | Burke et al. | |
| 2004/0120249 A1 | 6/2004 | Blasco Claret et al. | |
| 2005/0163261 A1 | 7/2005 | Nakao et al. | |
| 2005/0281238 A1 | 12/2005 | Blasco Clarest et al. | |
| 2006/0002494 A1 | 1/2006 | Zhang | |

(Continued)

FOREIGN PATENT DOCUMENTS

EP    0657997    6/1995

(Continued)

OTHER PUBLICATIONS

"International Search Report and Written Opinion of the International Searching Authority Dated Mar. 17, 2010", International Application No. PCT/US2009/046514.

(Continued)

*Primary Examiner* — Guerrier Merant

(57) ABSTRACT

An embodiment is a method and apparatus to interleave data. A demultiplexer demultiplexes an input packet having N bits into L sub-packets on L branches. M flipping blocks flip M of the L sub-packets. M is smaller than L. L sub-interleavers interleave the (L-M) sub-packets and the M flipped sub-packets. A concatenator concatenates the interleaved sub-packets to form an output packet.

22 Claims, 20 Drawing Sheets

U.S. PATENT DOCUMENTS

| | | | |
|---|---|---|---|
| 2006/0188033 | A1 | 8/2006 | Zehavi et al. |
| 2007/0030913 | A1 | 2/2007 | Lin |
| 2007/0139118 | A1 | 6/2007 | Teo et al. |
| 2009/0003308 | A1 | 1/2009 | Baxley et al. |
| 2009/0135977 | A1 | 5/2009 | Sheu |
| 2009/0190704 | A1 | 7/2009 | Ben-Ari et al. |

FOREIGN PATENT DOCUMENTS

| | | |
|---|---|---|
| EP | 0866580 | 9/1998 |
| EP | 1178634 | 2/2002 |
| EP | 1501226 | 1/2005 |
| EP | 1538744 | 6/2005 |
| GB | 2329804 | 3/1999 |
| WO | WO-01/13560 | 2/2001 |
| WO | WO-02/49263 | 6/2002 |
| WO | WO-03/056741 | 7/2003 |
| WO | WO-03/100996 | 12/2003 |
| WO | WO-2004/028105 | 4/2004 |
| WO | WO-2006/130502 | 12/2006 |

OTHER PUBLICATIONS

"INT5200 Single Chip PowerPacket(TM) Transceiver, Revision 4", *Intellon Corporation*, Retrieved from the Internet: URL: http://www.datasheeet4u.com/html/I/N/T/INT5200_InTellon.pdf.html, (2005).

Chen, Yi-Fu, et al., "Baseband Transceiver Design of a 128-Kbps Power-Line Modem for Household Applications", *IEEE Transactions on Power Delivery*, vol. 17, No. 2, (Apr. 2002), pp. 338-344.

Gault, Sophie, et al., "An OFDMA Based Modem for PowerLine Communications over the Low Voltage Distribution Network", *IEEE, Power Line Communications and Its Applications, 2005 International Symposium*, (Apr. 6-8, 2005), pp. 42-46.

Heo, Kyung L., et al., "Design of a High Speed OFDM Modem System for Powerline Communications", *IEEE Workshop, Signal Processing Systems (SIPS)*, (Oct. 16-18, 2002), pp. 264-269.

Hsieh, Meng-Han, et al., "A Low-Complexity Frame Synchronization and Frequency Offset Compensation Scheme for OFDM Systems over Fading Channels", *IEEE Transactions on Vehicular Technology*, vol. 48, No. 5, (Sep. 1999), pp. 1596-1609.

Hsu, Christine, et al., "Improving HomePlug Power Line Communications with LDPC Coded OFDM", *Annual International Telecommunications Energy Conference, 28th, IEEE, PI*, (Sep. 1, 2006), pp. 1-7.

Kwan, Tom, et al., "Adaptive Detection and Enhancement of Multiple Sinusoids Using a Cascade IIR Filter", *IEEE Transactions on Circuits and Systems*, vol. 36, No. 7, (Jul. 1989), pp. 937-947.

"International Search Report and Written Opinion of the International Searching Authority Dated Oct. 16, 2009", International Application No. PCT/US2009/046502.

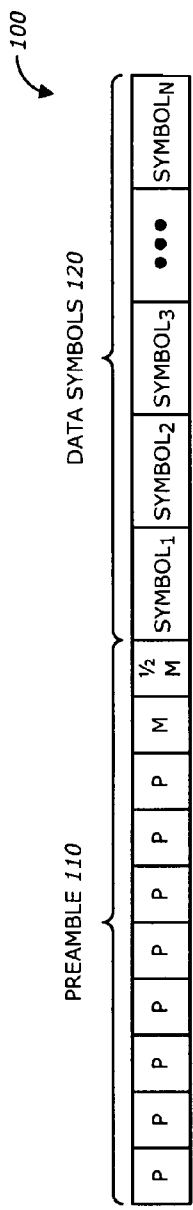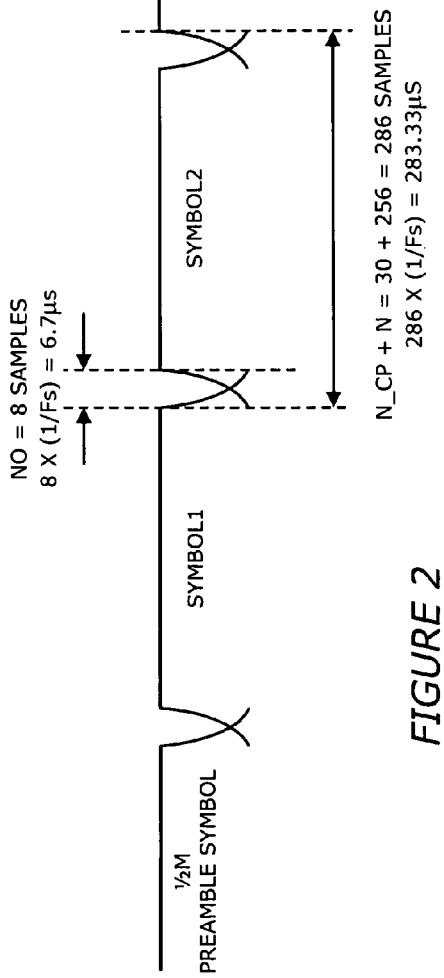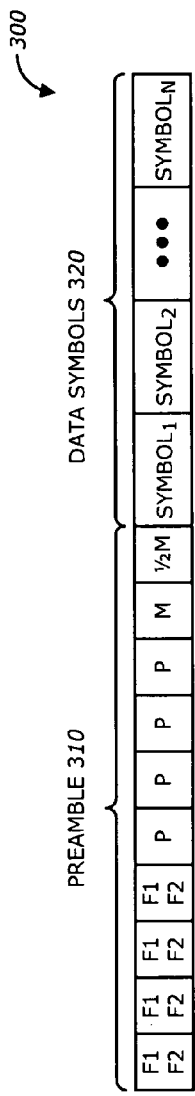

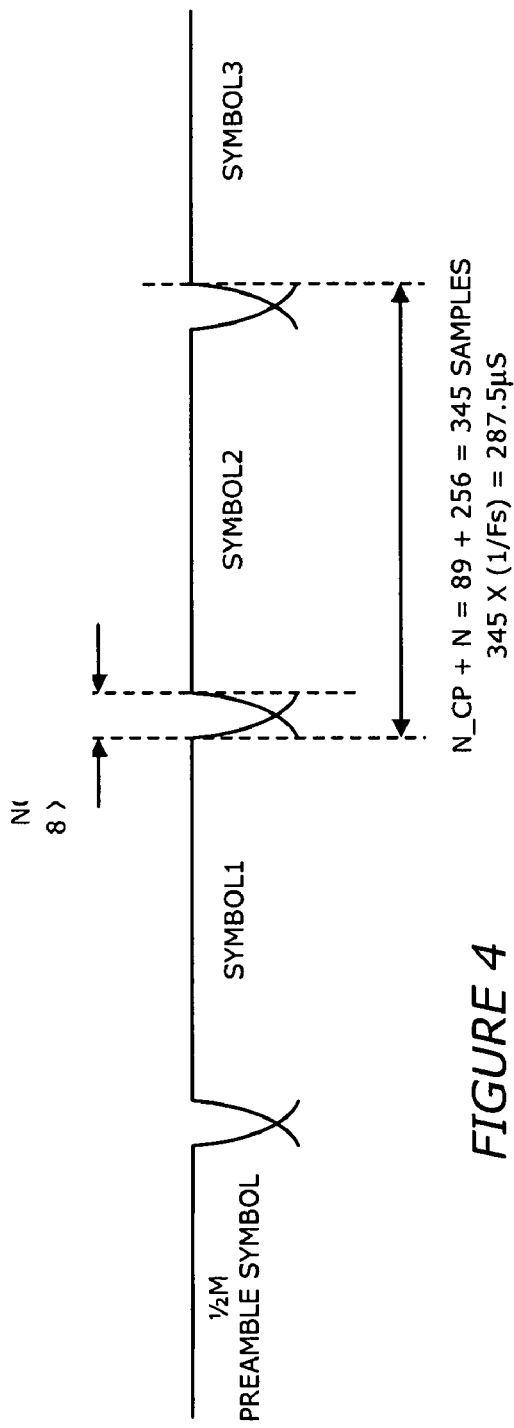

US 8,276,025 B2

BLOCK INTERLEAVING SCHEME WITH CONFIGURABLE SIZE TO ACHIEVE TIME AND FREQUENCY DIVERSITY

RELATED APPLICATIONS

This application claims the benefits of the provisional application, filed on Jun. 6, 2008, titled "Block interleaving scheme with configurable size to achieve time and frequency diversity in power line channel", Ser. No. 61/059,707.

TECHNICAL FIELD

The presently disclosed embodiments are directed to the field of communication, and more specifically, to power line communication.

BACKGROUND

Power line communication (PLC) is a communication technology to carry data on electrical media (e.g., wires) that are used for electrical power transmission. Typically, electrical power is transmitted over high voltage transmission lines, distributed over medium voltage, and used inside commercial or residential buildings at lower voltages. Since power line networks transmit data signals over the same electrical grid as that is used for carrying electrical power to commercial or residential buildings, electrical wires and sockets are used simultaneously for electricity and for data transmission, without causing disruption to either.

Broadband technologies provide high speed data transmission. However, currently it is problematic to apply broadband technologies in PLC. Some problems include the ability to efficiently decode signals in noisy channels, achieve time and frequency diversity, remove signal interference, maintain received signals at pre-determined levels, measure channel quality for high transmission rate, provide robustness to wideband and narrow band symbol synchronization.

SUMMARY

One disclosed feature of the embodiments is a method and apparatus to interleave data. A demultiplexer demultiplexes an input packet having N bits into L sub-packets on L branches. M flipping blocks flip M of the L sub-packets. M is smaller than L. L sub-interleavers interleave the (L−M) sub-packets and the M flipped sub-packets. A concatenator concatenates the interleaved sub-packets to form an output packet.

BRIEF DESCRIPTION OF THE DRAWINGS

Embodiments may best be understood by referring to the following description and accompanying drawings that are used to illustrate various embodiments. In the drawings.

FIG. 1 is a diagram illustrating a data frame structure used for data transmission and for the FCC, ARIB and CENELEC A bands according to one embodiment.

FIG. 2 is a diagram illustrating a symbol duration for data symbol according to one embodiment.

FIG. 3 is a diagram illustrating a data frame structure for data transmission for CENELECs B, C and BC according to one embodiment.

FIG. 4 is a diagram illustrating a symbol duration for data symbol for CENELC B and C according to one embodiment.

FIG. 5 is a diagram illustrating ACK signal for FCC, ARIB and CENELEC A according to one embodiment.

FIG. 6 is a diagram illustrating ACK signal for CENELEC B, C, and BC according to one embodiment.

DETAILED DESCRIPTION

Figure 7:
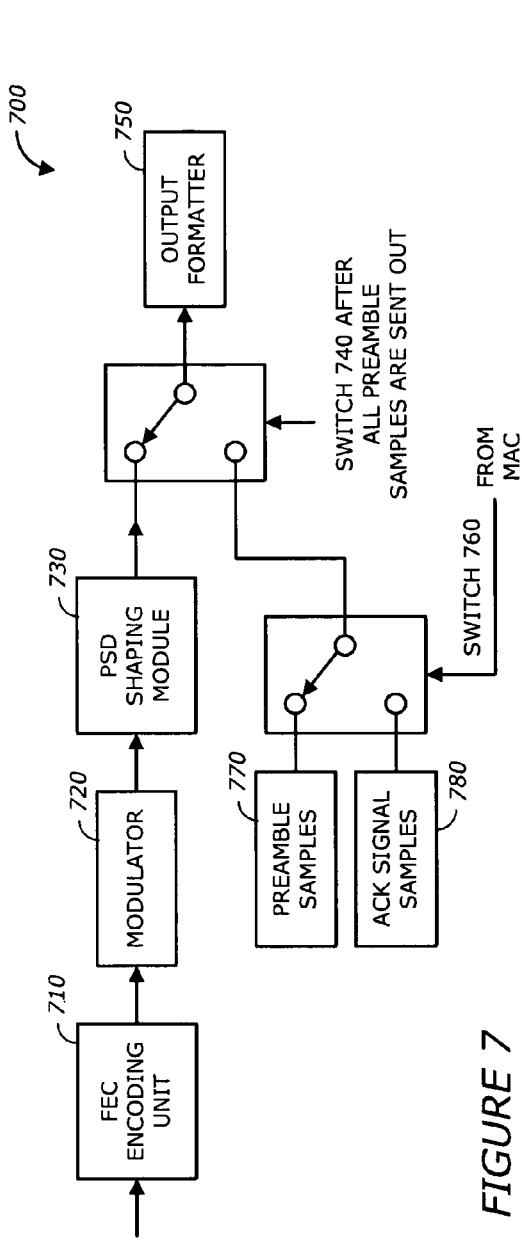
FIG. 7 is a diagram illustrating a base-band transmitter according to one embodiment.

One disclosed feature of the embodiments is a method and apparatus to interleave data. A demultiplexer demultiplexes an input packet having N bits into L sub-packets on L branches. M flipping blocks flip M of the L sub-packets. M is smaller than L. L sub-interleavers interleave the (L-M) sub-packets and the M flipped sub-packets. A concatenator concatenates the interleaved sub-packets to form an output packet.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is the implementation of a data communication modem for Federal Communication Commission (FCC), Association of Radio Industries and Businesses (ARIB), and European Committee of electrotechnical standardization or Comite Europeen de Normalisation Electrotecnique (CENELEC) bands over the power line medium. The system may include a highly integrated PHY (physical layer) and MAC (Media Access Control) digital transceiver and analog front end processing circuits. The system is based on Orthogonal Frequency Division Multiplexing (OFDM). OFDM has been chosen as the modulation technique because of its inherent adaptability in the presence of frequency selective channels, its resilience to jammer signals, and its robustness to impulsive noise.

The OFDM system may place $N_{carrier}$ evenly spaced carriers into a specified frequency band such as from DC to 1.2 MHz. In one embodiment, $N_{carrier}=128$. In the following description, the value $N_{carrier}=128$ will be used for illustrative purposes. It is contemplated that $N_{carrier}$ may be any suitable number. Depending on the band selection, number of carriers participating in transporting data varies. Every carrier may be modulated with Differential Binary Phase Shift Keying (DBPSK). The system may support two modes of operation namely Normal and ROBO (Robust OFDM). The ROBO modulation is robust in the sense that it may provide four times extra redundancy parity bits by mean of repetition code and therefore the system may reliably deliver data under severe channel conditions.

The system parameters include signal frequency bands, modulation schemes, sampling frequency and physical layer frame structure, etc. The system supports various CELENEC, FCC and ARIB bands. The frequency band associated with each standard is given in Table 1.

TABLE 1

FCC, ARIB and CENELEC Bands

| | F Low (KHz) | F High (KHz) |
| --- | --- | --- |
| FCC | 10 | 480 |
| ARIB | 10 | 450 |
| CELENEC A | 9 | 95 |
| CELENEC B | 95 | 125 |
| CELENEC C | 125 | 140 |
| CELENEC B, C | 95 | 140 |

An OFDM with DBPSK modulation scheme per carrier may be selected. The OFDM modulation technique is very robust against channel fading, narrowband interference and spike noise. The DBPSK modulation for each carrier may make the receiver design significantly simple since no tracking circuitry is required at the receiver for coherently detecting the phase of each carrier. In DBPSK demodulator, the phases of carriers in adjacent symbol may be taken as the reference for detecting the phases of the carriers in the current symbol. The phases of corresponding carriers in adjacent OFDM symbols may be expected to be stationary since the channel and the clock frequency variations in time are very slow as compared to the duration of two adjacent symbols.

Assuming the maximum spectral content of the signal is 480 KHz, the sampling frequency at the transmitter and receiver may be selected to be 1.2 MHz that is about 240 KHz above the Nyquist rate to provide a sufficient margin for signal filtering in the transmitter (for PSD shaping to remove the signal images) and at the receiver (for band selection and signal enhancement).

The number of frequency bins (FFT points) may be any suitable number. In one embodiment, this number is selected to be N=256. This results in a frequency resolution for the OFDM carriers equal to 4.6875 KHz (Fs/N). Note that imperfection such as sampling clock frequency variation may cause Inter Carrier Interference (ICI). In practice, the ICI caused by a typical sampling frequency variation about 2% of frequency resolution is negligible. In other word, considering ±20 ppm sampling frequency in transmitter and receiver clocks, the drift of the carriers may be approximately equal to 48 Hz that is approximately 1.26% of the selected frequency resolution. Considering these selections, the number of usable carriers for each standard may be obtained as given in Table 2.

TABLE 2

Number of carriers for various bands

| | Number of Carriers (Ncarr) (KHz) | First Carrier (KHz) | Last Carrier (KHz) |
| --- | --- | --- | --- |
| FCC | 100 | 14.063 | 478.125 |
| ARIB | 93 | 14.0625 | 445.3125 |
| CELENEC A | 19 | 9.375 | 93.75 |
| CELENEC B | 6 | 98.4375 | 121.875 |
| CELENEC C | 3 | 126.5625 | 135.9375 |
| CELENEC B, C | 9 | 98.4375 | 135.9375 |

The system may work in two different modes namely Normal and ROBO modes. In Normal mode, the FEC may include a Reed Solomon encoder and a convolutional encoder. The system may also support Reed Solomon code with parity of 8 and 16 Bytes.

In ROBO mode (robust modulation scheme) the FEC may include Reed Solomon and convolutional encoders followed by a Repetition Code (RC). The RC code may repeat each bit four times making system more robust to channel impairments. This of course may reduce the throughput by a factor of 4. The FEC parameters for RS parity of 8 may be given in Table 3.

TABLE 3

FEC Parameters

| | Normal Mode | ROBO Mode |
| --- | --- | --- |
| FCC | ½ convolutional Code + Reed Solomon (241/249) | ½ convolutional Code + Reed Solomon (53/61) + RC (4) |
| ARIB | ½ convolutional Code + Reed Solomon (223/231) | ½ convolutional Code + Reed Solomon (49/57) + RC (4) |

TABLE 3-continued

FEC Parameters

| | Normal Mode | ROBO Mode |
|---|---|---|
| CENELEC A | ½ convolutional Code + Reed Solomon (181/189) | ½ convolutional Code + Reed Solomon (38/46) + RC (4) |
| CENELEC BC | ½ convolutional Code + Reed Solomon (171/179) | ½ convolutional Code + Reed Solomon (36/44) + RC (4) |
| CENELEC B | ½ convolutional Code + Reed Solomon (111/119) | ½ convolutional Code + Reed Solomon (21/29) + RC (4) |
| CENELEC C | ½ convolutional Code + Reed Solomon (111/119) | ½ convolutional Code + Reed Solomon (21/29) + RC (4) |

The number of symbols in each PHY (Physical Layer) frame may be selected based on two parameters, the required data rate and the acceptable delay. Since high bandwidth standard (FCC, ARIB) may be utilized for some delay sensitive applications such as voice transmission, therefore the number of symbols in PHY frame may be selected less that that of low bandwidth standard (CENELEC). The number of symbols and data rate associated with each band may be tabulated in Table 4. To calculate the data rate, the packets may be assumed to be continuously transmitted with no inter frame time gap.

TABLE 4

Data rate for various standards

| | Data Rate (DBPSK) (kbps) | Data Rate (ROBO) (kbps) | No. of symbols per PHY Frame (Ns) |
|---|---|---|---|
| FCC | 170 | 37 | 40 |
| ARIB | 157 | 34 | 40 |
| CELENEC A | 37 | 7.7 | 160 |
| CELENEC B | 9.71 | 1.84 | 320 |
| CELENEC C | 4.9 | 0.93 | 640 |
| CELENEC B, C | 14.95 | 3.15 | 320 |

The data rate may be calculated based on the number of symbols per PHY frame (NS), number of carrier per symbol (Ncarr) and number of parity bits added by FEC blocks. As an example, consider the system in the FCC band working in ROBO mode. Total number of bits carried by the whole PHY frame may be equal to:

$$Total\_No\_Bits = NS \times Ncarr = 40 \times 100 = 4000 \text{ bits}$$

The number of bits required at the input of ROBO encoder may be given by:

$$No\_Bits\_ROBO = 4000 \times ROBORate = 4000 \times \frac{1}{4} = 1000 \text{ bits}$$

Considering the fact that convolutional encoder may have a rate equal to ½ (CCRrate=½) and also consider adding CCZerotail=6 bits of zeros to terminate the states of the encoder to all zero states then the maximum number of symbols at the output of Reed Solomon encoder (MAXRSbytes) may be equal to:

$$MAXRSbytes = floor((No\_Bits\_ROBO \times CCRate \times CC\text{-}ZeroTail)/8) = floor((1000 \times \frac{1}{2} - 6)/8) = 61$$

Symbols: Removing 8 symbols associated with the parity bits, we may obtain:

$$DataLength = (61 - ParityLength) \times 8 = 424 \text{ bits}$$

These 424 bits may be carried within the duration of a PHY frame. The duration of a PHY frame may be calculated by the following formula:

$$T\_Frame = ((NS \times (N\_CP + N - NO) + (Npre \times N)))/Fs$$

where Npre, N, NO and N_CP are the number of samples in the preamble, FFT length, the number of samples overlapped at each side of one symbol and the number of samples in the cyclic prefix, respectively. The Fs is the sampling frequency. Typical values for all these parameters for various frequency bands may be given in Table 5.

TABLE 5

Parameters for various frequency bands

| Number of FFT points | N = 256 |
|---|---|
| Number of overlapped samples | NO = 8 |
| Number of cyclic Prefix (CENELEC B and C) | N_CP = 89 |
| Number of cyclic Prefix (FCC, ARIB, CENELEC A) | N_CP = 30 |
| Sampling frequency | Fs = 1.2 MHz |

Replacing the above numbers in the equation, T-Frame (PHY frame duration) may be obtained as follows:

$$T\_Frame = (40 \times (256 + 22) + (9.5 \times 256))/1200000 = 0.0112 \text{ sec}.$$

Therefore the data rate may be calculated by:

$$Data \text{ rate} = 424/0.0112 \sim 37 \text{ kbps}$$

Signal Types: There are 2 transmission commands to the physical layer as described below.

FIG. 1 is a diagram illustrating a data frame structure 100 used for data transmission and for the FCC, ARIB and CENELEC A bands according to one embodiment. The data frame 100 includes a preamble portion 110 and a data symbol portion 120.

The preamble 110 may include 8 identical P symbols and 1½ identical M symbols. Each symbol may be 256 samples and may be pre-stored in the transmitter and may be transmitted right before the data symbols. The symbols P may be used for AGC adaptation, symbol synchronization, channel estimation and initial phase reference estimation. For M symbols, two types of symbol may be used. One is the M1 in which all the carriers may be π phase shifted and the other one is M2 in which all the carriers may be π/2 phase shifted. M1 is used in ROBO mode and M2 may be used in Normal mode. At the receiver, the phase distance between symbol P and symbol M waveforms may be used for frame synchronization purpose. And the distance between the phases of two possible M symbols may be used to detect whether the PHY frame is sent in Normal mode or in ROBO mode.

FIG. 2 is a diagram illustrating a symbol duration for data symbol according to one embodiment. Each symbol may have 8 samples overlapped with adjacent symbols. The last 8 samples (tail) of preamble may also be overlapped with the 8 samples of the first data symbol (head) as shown in the FIG. 2. The overlap may be included to smooth the transition between symbols thus reducing the out of band spectral growth.

FIG. 3 is a diagram illustrating a data frame structure 300 for data transmission for CENELECs B, C and BC according to one embodiment. The data frame 300 includes a preamble portion 310 and a data symbol portion 320.

The preamble 310 for CENELECs B, C & BC bands may include for special symbols labeled as F1F2 symbols, followed by four identical P symbols and 1½ identical M symbols. For CENELEC C, each F1F2 symbol may include three sinewaves whose phases may switch by 180° after 256 samples. Hence, we generate 256 samples of each of the three tones and sum them together, then we add 180° phase shift to each of the three tones and generate another 257 samples, so that the total length of an F1F2 symbol may be 513 samples.

For CENELECs B & BC, six tones may be used instead of three, but the length of the F1F2 symbols remains unchanged. The F1F2 symbols may be used for synchronization. Each preamble symbol may contain 513 samples. The reason that we have used a different technique for synchronization is that the allocated bandwidth in CENELECs C, B and BC may be too small, which makes the autocorrelation property of the P symbols not good enough for robust synchronization. As a result, F1F2 symbols may be used. They have much better autocorrelation property. As for the P symbols for narrowband, they may still be used for channel estimation and initial phase reference estimation, same as was the case for wideband. The symbols M1 or M2 proposed for FCC, ARIB and CENELEC standards are also used for narrowband for the same purposes (frame synchronization and mode detection).

FIG. 4 is a diagram illustrating a symbol duration for data symbol for CENELC B and C according to one embodiment. Again, the same approach is used for PHY frame in ROBO mode that is the P and M symbol are exchanged.

ACK/NACK Signal

FIG. 5 is a diagram illustrating ACK signal for FCC, ARIB and CENELEC A according to one embodiment. This signal may be used when an acknowledgement is required to confirm whether the data is correctly received (ACK) or it is erroneous (NACK). The same waveform used in preamble with modified M symbol may be used as an ACK signal. The P with 90 degrees shift (M=jP) and P with 180 degrees shift (M=−P) may already reserved for normal mode and ROBO mode respectively. The P with 270 degrees shift (M=−jP) may be proposed to be used for ACK signaling.

This may simplifies the system, as only one waveform need to be stored in the transmitter and same detection circuit in the receiver as used for preamble detection, is used for ACK signal detection as well. If no signal is received during the specified period, it is interpreted as a NACK signal.

FIG. 6 is a diagram illustrating ACK signal for CENELEC B, C, and BC according to one embodiment. Again the same symbols as used for the preamble for the purpose of synchronization, may also be used for the ACK signal. During the time period that a device is waiting for an acknowledgement, the reception of this signal may be an indication that the data may have been delivered with no error. If the time expires and the ACK signal has not been received, it may be an indication that the data may have been lost or delivered in errors.

FIG. 7 is a diagram illustrating a base-band transmitter 700 according to one embodiment. The base-band transmitter 700 includes a Forward Error Correction (FEC) encoding unit 710, a modulator 720, a power spectral shaping (PSD) module 730, a switch 740, an output formatter 750, and a switch 760.

The base-band transmitter 700 may receive its input bits in one packet from the Media Access (MAC) Layer. The FEC encoding unit 710 may include a number of FEC encoders. Each FEC encoder may add parity bits to the data and the packet grows as it goes through various blocks in FEC encoding unit 710. At the end of the FEC encoding unit 710, the final packet may be broken down into small packet so that each small packet may be fitted into one OFDM symbol. The size of one small packet depends on the number of carriers used in each OFDM symbol. For example, in FCC band, the packet size becomes equal to 100 bits. In order to understand the size of data as well as signal dimensions at each various points in the transmitter baseband, the calculation method may be described in the following.

Packet size calculation:

The total number of bits carried by a PHY frame may be obtained by:

$$N_F = N_G = Ncarr \times Ns$$

The $N_F$ and $N_G$ may represent the size of packet (signal) at nodes (F) and (G), respectively. Where Ncarr is the number of carriers in each OFDM symbol and Ns is the number of symbols per PHY frame. Note that the Interleaver does not change the size of packet. The number of bits at point (E) may be given by:

$$N_E = N_F \times R$$

The value R may be one for Normal mode and ¼ for ROBO Mode. In order to find M, the number of zeros may need to be padded at the output of convolutional encoder; first we need to calculate the maximum number of RS bytes. The maximum number of RS bytes (MaxRSbytes) at the output of RS encoder may be obtained by the following equation:

$$\text{MaxRSbytes} = \text{floor}((N_E \times CCRate - CCZeroTail)/8)$$

Where CCRate and CCZeroTail are the convolutional code rate (½) and the number of zeros to be added to the input of convolutional encoder (to terminate the states to zero state), respectively. And "8" refers to the length of each RS word that is one byte. Therefore, the value of M may be obtained by:

$$M = N_E - ((\text{MaxRSbytes} \times 8) + 6) \times 2$$

Table 6 shows the number of zeroes padded after convolutional encoder for various bands.

TABLE 6

Number of zeroes padded after convolutional encoder

|  | ROBO (Bits) | Normal (bits) |
|---|---|---|
| FCC | M = 12 | M = 4 |
| ARIB | M = 6 | M = 12 |
| CELENEC A | M = 12 | M = 4 |
| CELENEC B | M = 4 | M = 4 |
| CELENEC C | M = 4 | M = 4 |
| CELENEC B, C | M = 4 | M = 4 |

The number of bits at point (D), (C) and (B) now may be calculated by:

$$N_D = N_E - M, \; N_C = N_D/2, \; N_B = N_C - 6$$

Finally, considering the fact the number of parity bytes in RS code may be equal to 8, the packet size delivered by MAC to the physical layer may be given by:

$$N_A = (N_B/8 - 8) \times 8$$

Table 7 summarizes the input packet to the physical layer for various band and both normal and ROBO modes. It should be noted that CENELEC B and CENELEC C ROBO may not be able to have long header format (48-bit addressing) and RS parity of 16 Bytes at the same time because of the size of the packet limitations.

TABLE 7

Packet size delivered by MAC layer to PHY layer

|  | ROBO (bits) | Normal (bits) |
|---|---|---|
| FCC | 424 | 1928 |
| ARIB | 392 | 1784 |
| CELENEC A | 304 | 1448 |

TABLE 7-continued

Packet size delivered by MAC layer to PHY layer

|  | ROBO (bits) | Normal (bits) |
|---|---|---|
| CELENEC B | 168 | 888 |
| CELENEC C | 168 | 888 |
| CELENEC B, C | 288 | 1368 |

Figure 8:
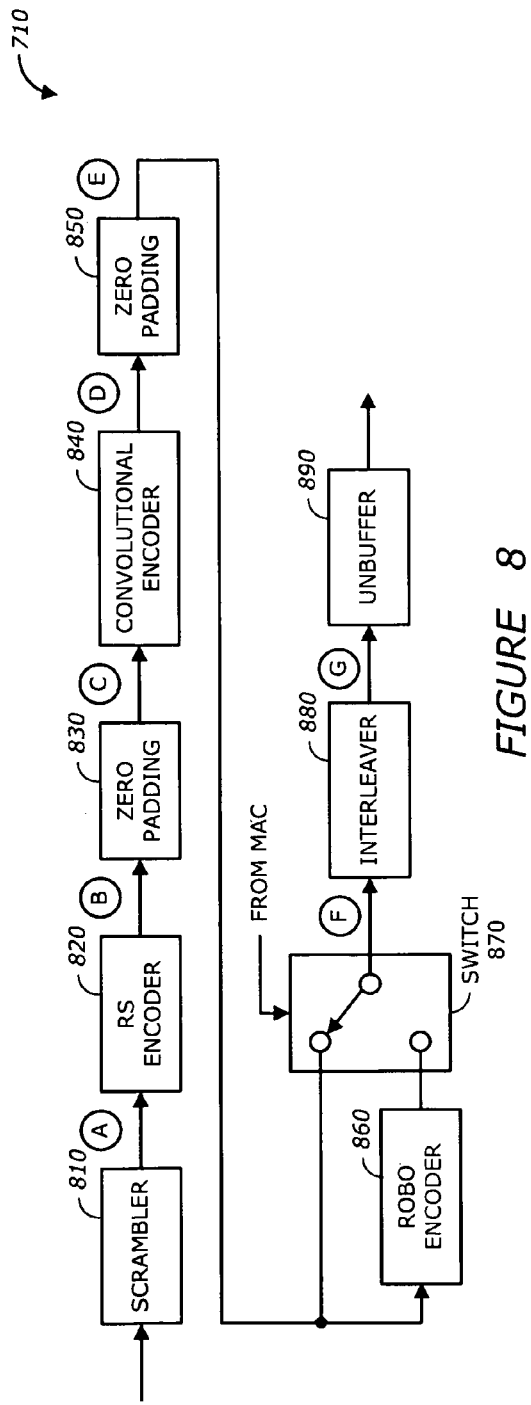
FIG. 8 is a diagram illustrating the FEC encoding unit according to one embodiment.

The packet size at various nodes in the FEC encoding unit 710 for each band (CENELEC (A,B,BC)/FCC/ARIB) may be calculated and summarized in Tables 8A, 8B, 8C, 8D, 8E, and 8F. The nodes A, B, C, D, E, and F are shown in FIG. 8.

TABLE 8A

Packet Size at various node of FEC encoder for FCC band

| BFEC Node | Normal Mode | ROBO Mode |
|---|---|---|
| A | 1928 | 424 |
| B | 1992 | 428 |
| C | 1998 | 494 |
| D | 3996 | 988 |
| E | 4000 | 1000 |
| F | 4000 | 4000 |

TABLE 8B

Packet Size at various node of FEC encoder for ARIB band

| FEC Node | Normal Mode | ROBO Mode |
|---|---|---|
| A | 1784 | 392 |
| B | 1848 | 456 |
| C | 1854 | 462 |
| D | 3708 | 924 |
| E | 3720 | 930 |
| F | 3720 | 3720 |

TABLE 8C

Packet Size at various nodes of FEC encoder for CENELEC A band

| FEC Node | Normal Mode | ROBO Mode |
|---|---|---|
| A | 1448 | 304 |
| B | 1512 | 368 |
| C | 1518 | 374 |
| D | 3036 | 748 |
| E | 3040 | 760 |
| F | 3040 | 3040 |

TABLE 8D

Packet Size at various node of FEC encoder for CENELEC B band

| FEC Node | Normal Mode | ROBO Mode |
|---|---|---|
| A | 888 | 168 |
| B | 952 | 232 |
| C | 958 | 238 |
| D | 1916 | 476 |
| E | 1920 | 480 |
| F | 1920 | 1920 |

TABLE 8E

Packet Size at various node of FEC encoder for CENELEC C band

| FEC Node | Normal Mode | ROBO Mode |
|---|---|---|
| A | 888 | 168 |
| B | 952 | 232 |
| C | 958 | 238 |
| D | 1916 | 476 |
| E | 1920 | 480 |
| F | 1920 | 1920 |

TABLE 8F

Packet Size at various nodes of FEC encoder for CENELEC BC band

| FEC Node | Normal Mode | ROBO Mode |
|---|---|---|
| A | 1368 | 288 |
| B | 1432 | 352 |
| C | 1438 | 358 |
| D | 2876 | 716 |
| E | 2880 | 720 |
| F | 2880 | 2880 |

FIG. 8 is a diagram illustrating the FEC encoding unit 710 according to one embodiment. The FEC encoding unit 710 includes a data scrambler 810, a Reed-Solomon (RS) encoder 820, a zero padding 830, a convolutional encoder 840, a zero padding 850, a ROBO encoder 860, a switch 870, an interleaver 880, and an un-buffer 890. It is noted that the FEC encoding unit 710 may include more or less than the above elements. In addition, any one of the above elements may be implemented by hardware, software, firmware, or any combination of hardware, software, and firmware.

Figure 9A:
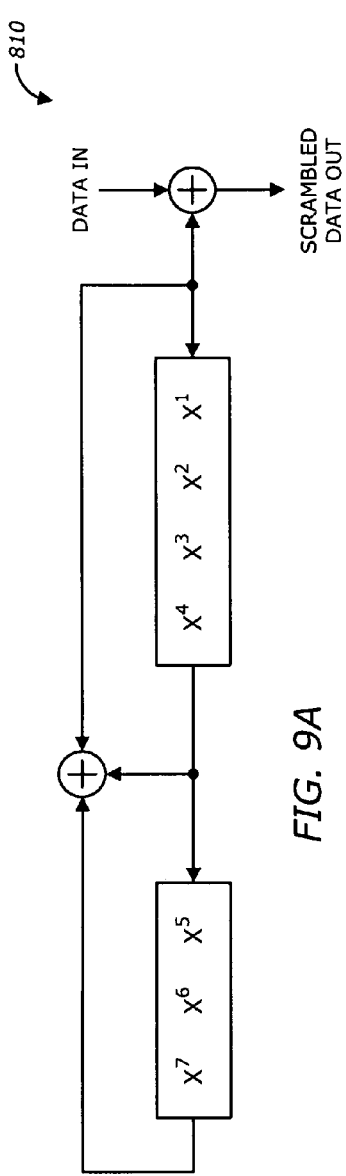
FIG. 9A is a diagram illustrating the data scrambler according to one embodiment.

The FEC encoders may include Reed Solomon encoder 820 followed by convolutional encoder 840. In ROBO mode, an extra encoder namely Repetition Code (RC) or ROBO encoder 860 may be used after the convolutional encoder 840 that repeats the bits at the output of convolutional encoder 840 four times The data scrambler 810 may help give the data a random distribution. FIG. 9A is a diagram illustrating the data scrambler 810 according to one embodiment. The data stream may be XOR-ed with a repeating pseudo random number (PN) sequence using the following generator polynomial: $S(x) = x^7 + x^4 + 1$. The bits in the scrambler are initialized to all ones at the start of processing each PHY frame.

The RS encoder 820 encodes data from the scrambler 810. The RS encoder 820 may be may be created by shortening RS (255,247, t=4) and (255,239, t=8) code. The "RS symbol word length" (i.e., the size of the data words used in the Reed-Solomon block) may be fixed at 8 bits. The value of t (number of word errors that can be corrected) may be either 4 or 8 for different standards. For CENELEC B and C ROBO the RS parity of 8 Bytes (corresponding to t=4) should be used. The number of parity words in a RS-block is thus 2t words. The number of non-parity data words (bytes) in Reed-Solomon encoder 820 may be provided in Table 3. The first bit in time from the data scrambler 810 may become the most significant bit of that symbol. Each RS encoder input block (consisting of 247 symbols) is conceptually formed by one or more fill symbols ("00000000") followed by the message symbols. Output of the RS encoder (with fill symbols discarded) may proceed in time from first message symbol to last message symbol followed by parity symbols, with each symbol shifted out most significant bit first.

Code Generator Polynomial $g(x)=(x-\alpha^1)(x-\alpha^2)(x-\alpha^3)\ldots(x-\alpha^8)$ Field Generator Polynomial: $p(x)=x^8+x^4+x^3+x^2+1$ (435 octal)

TABLE 9

RS encoder input/output packet size

| | Normal Mode $N_A/N_B$ (Bytes) | ROBO Mode $N_A/N_B$ (Bytes) |
|---|---|---|
| FCC | 241/249 | 53/61 |
| ARIB | 223/231 | 49/57 |
| CENELEC A | 181/189 | 38/46 |
| CENELEC BC | 171/179 | 36/44 |
| CENELEC B | 111/119 | 21/29 |
| CENELEC C | 111/119 | 21/29 |

The representation of $\alpha^0$ is "00000001", where the left most bit of this RS symbol is the MSB and is first in time from the scrambler 810 and is the first in time out of the RS encoder 820. The packet size (in Bytes) at the input and output of RS encoder 820 ($N_A$ and $N_B$) may be given in Table 9.

The zero padding 830 may pad six zeroes after the RS encoder 820.

Figure 9B:
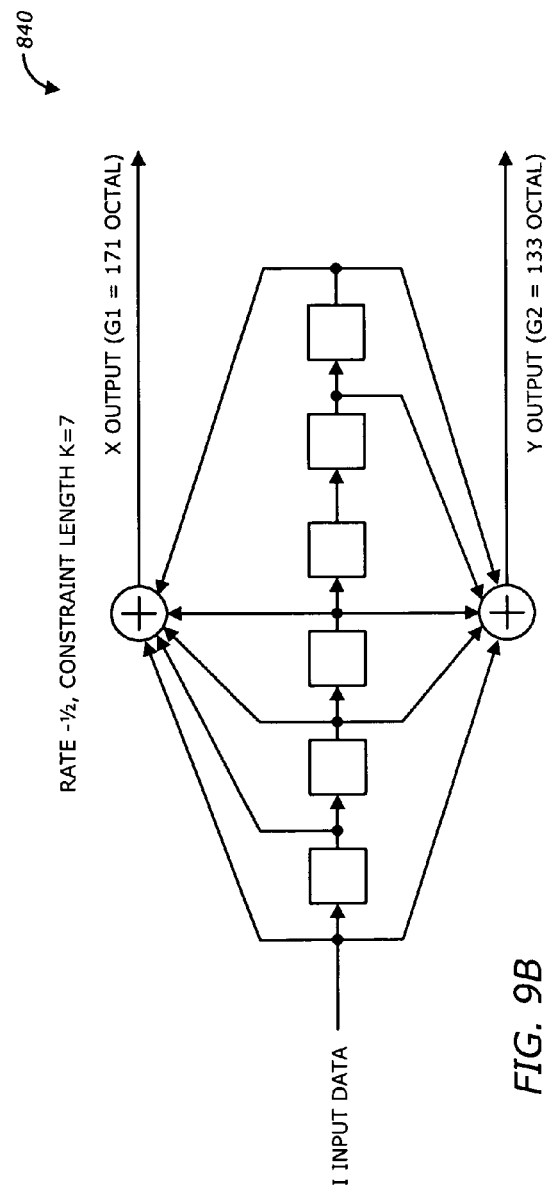
FIG. 9B is a diagram illustrating the convolutional encoder according to one embodiment.

FIG. 9B is a diagram illustrating the convolutional encoder 840 according to one embodiment. The convolutional encoder 840 may encode the bit stream at the output of the Reed-Solomon encoder 820 with a standard rate=½, K=7. The tap connections are defined as x=0b1111001 and y=0b1011011, as shown in FIG. 9B.

When the last bit of data to the convolutional encoder 840 may have been received, the convolutional encoder 840 may insert six tail bits, which may be required to return the convolutional encoder 840 to the "zero state". This may improve the error probability of the convolutional decoder, which relies on future bits when decoding. The tail bits may be defined as six zeros. The number of bits at the input and the output of convolutional encoder may be given in Table 10.

TABLE 10

Convolutional encoder input/output packet sizes

| | Normal Mode $N_A/N_B$ (bits) | ROBO Mode $N_A/N_B$ (bits) |
|---|---|---|
| FCC | 1998/3996 | 494/988 |
| ARIB | 1854/3708 | 462/924 |
| CENELEC A | 1518/3036 | 374/748 |
| CENELEC BC | 1438/2876 | 358/716 |
| CENELEC B | 958/1916 | 238/476 |
| CENELEC C | 958/1916 | 238/476 |

The zero padding 850 may pad M zeroes after the convolutional encoder 840. M is given in Table 6.

The ROBO encoder 860 repeats the resulting packet after adding M number of zeros to the packet four times in ROBO mode. The ROBO encoder 860 may be only activated in ROBO mode. The repeat code may be implemented inside the interleaver 880. The switch 870 selects whether to bypass the ROBO encoder 860 or uses the output of the ROBO encoder 860 in ROBO mode.

The interleaver 880 interleaves the data packet selected from the switch 870. It may be used for both normal mode and ROBO mode. The interleaver 880 may use a linear block interleaver and may achieve the same performance of a random interleaver using a simpler architecture with less computation.

The un-buffer 890 breaks down the final packet into small packet so that each small packet may be fitted into one OFDM symbol, as described earlier.

Figure 10:
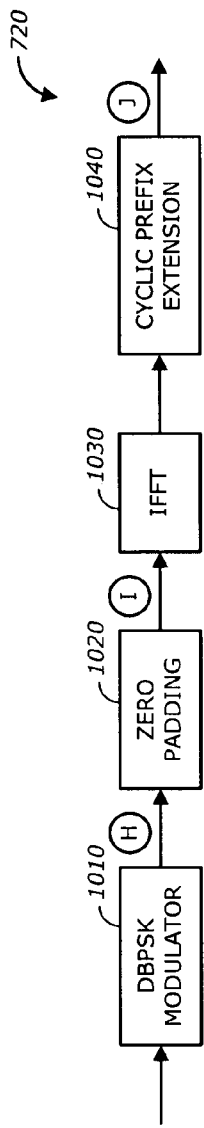
FIG. 10 is a diagram illustrating the modulator according to one embodiment.

FIG. 10 is a diagram illustrating the modulator 720 according to one embodiment. The modulator 720 includes a DBPSK modulator 1010, a zero padding 1020, an inverse Fast Fourier Transform (IFFT) 1030, and a cyclic prefix (CP) extension 1040. It is noted that the modulator 720 may include more or less than the above elements. In addition, any one of the above elements may be implemented by hardware, software, firmware, or any combination of hardware, software, and firmware.

Figure 11A:
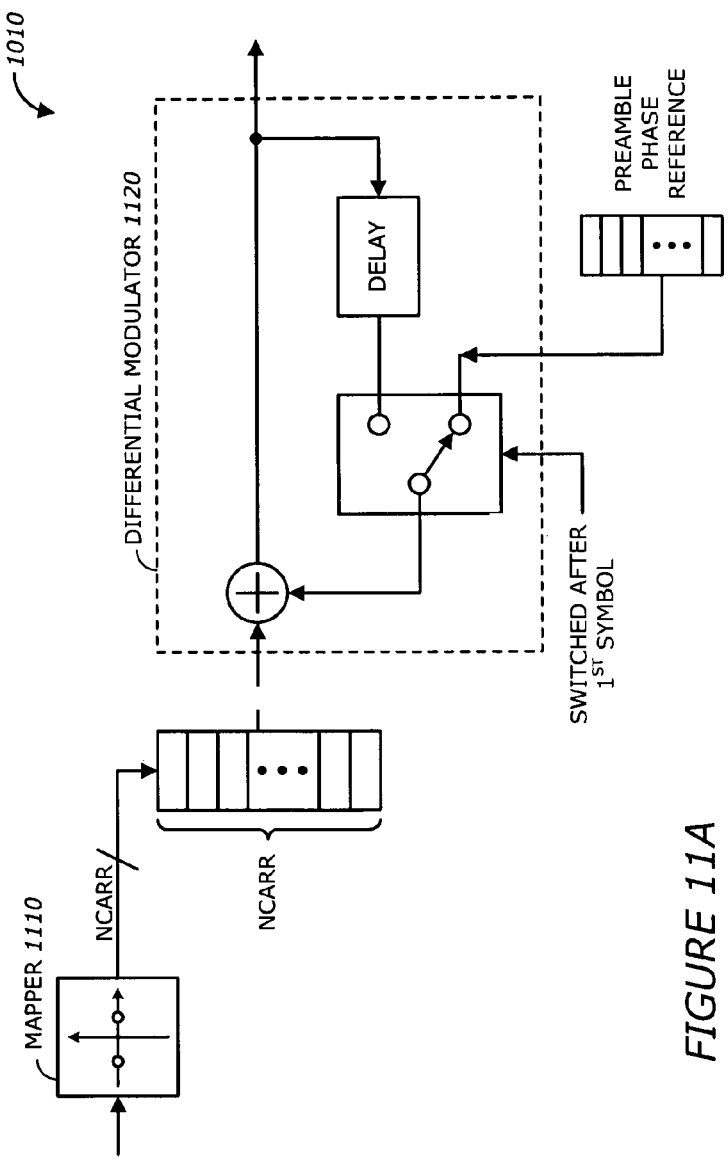
FIG. 11A is a diagram illustrating the DBPSK modulator according to one embodiment.

FIG. 11A is a diagram illustrating the DBPSK modulator 1010 according to one embodiment. The DBPSK modulator 1010 includes a mapper 1110 and a differential modulator 1120.

The mapper 1110 map data bits for differential modulation. Each phase vector may use its predecessor (same carrier, previous symbol) as phase reference. The mapping function for DBPSK may be given in Table 11.

TABLE 11

DBPSK Encoding Table of Kth Sub carrier

| Input Bit | Output Phase |
|---|---|
| 0 | $\Psi_k$ |
| 1 | $\Psi_k + \pi$ |

The initial phase for the first symbol are the carrier phases of the preamble symbol and are provided in Table 12. Each value in Table 12 may be a multiple integer of $\pi/8$ and may be quantized by 4 bits. The preamble phase reference index in Table 12 may start from 1 and it may refer to the first carrier in the corresponding band as given in Table 13. Note that the carrier index may be numbered from 0 to 127. This may be been illustrated in FIG. 11B.

TABLE 12

Preamble Phase Vector Definition

| c | FCC $\phi_c$ | ARIB $\phi_c$ | CNLC A $\phi_c$ | CNLC B $\phi_c$ | CNLC C $\phi_c$ | CNLC BC $\phi_c$ |
|---|---|---|---|---|---|---|
| 1 | 14 | 14 | 14 | X | X | X |
| 2 | 14 | 14 | 13 | X | X | X |
| 3 | 13 | 13 | 11 | X | X | X |
| 4 | 13 | 12 | 9 | X | | X |
| 5 | 12 | 12 | 6 | X | | X |
| 6 | 11 | 11 | 2 | X | | X |
| 7 | 10 | 10 | 12 | | | X |
| 8 | 9 | 8 | 6 | | | X |
| 9 | 8 | 7 | 14 | | | X |
| 10 | 6 | 6 | 6 | | | |
| 11 | 5 | 4 | 12 | | | |
| 12 | 3 | 2 | 2 | | | |
| 13 | 1 | 0 | 7 | | | |
| 14 | 14 | 13 | 10 | | | |
| 15 | 12 | 11 | 13 | | | |
| 16 | 9 | 8 | 15 | | | |
| 17 | 7 | 5 | 0 | | | |
| 18 | 4 | 2 | 1 | | | |
| 19 | 1 | 15 | 1 | | | |
| 20 | 14 | 11 | | | | |
| 21 | 10 | 8 | | | | |
| 22 | 7 | 4 | | | | |
| 23 | 4 | 0 | | | | |
| 24 | 0 | 12 | | | | |
| 25 | 11 | 8 | | | | |
| 26 | 8 | 4 | | | | |

TABLE 12-continued

Preamble Phase Vector Definition

| c | FCC $\phi_c$ | ARIB $\phi_c$ | CNLC A $\phi_c$ | CNLC B $\phi_c$ | CNLC C $\phi_c$ | CNLC BC $\phi_c$ |
|---|---|---|---|---|---|---|
| 27 | 3 | 15 | | | | |
| 28 | 15 | 10 | | | | |
| 29 | 10 | 5 | | | | |
| 30 | 5 | 0 | | | | |
| 31 | 0 | 11 | | | | |
| 31 | 11 | 5 | | | | |
| 33 | 6 | 0 | | | | |
| 34 | 0 | 10 | | | | |
| 35 | 11 | 4 | | | | |
| 36 | 5 | 14 | | | | |
| 37 | 15 | 7 | | | | |
| 38 | 9 | 1 | | | | |
| 39 | 3 | 10 | | | | |
| 40 | 12 | 3 | | | | |
| 41 | 6 | 12 | | | | |
| 42 | 15 | 5 | | | | |
| 43 | 8 | 14 | | | | |
| 44 | 1 | 6 | | | | |
| 45 | 10 | 14 | | | | |
| 46 | 3 | 7 | | | | |
| 47 | 11 | 14 | | | | |
| 48 | 3 | 6 | | | | |
| 49 | 11 | 14 | | | | |
| 50 | 3 | 5 | | | | |
| 51 | 11 | 12 | | | | |
| 52 | 3 | 3 | | | | |
| 53 | 10 | 10 | | | | |
| 54 | 1 | 1 | | | | |
| 55 | 9 | 7 | | | | |
| 56 | 15 | 14 | | | | |
| 57 | 7 | 4 | | | | |
| 58 | 13 | 10 | | | | |
| 59 | 4 | 0 | | | | |
| 60 | 10 | 6 | | | | |
| 61 | 0 | 11 | | | | |
| 62 | 6 | 0 | | | | |
| 63 | 12 | 5 | | | | |
| 64 | 1 | 10 | | | | |
| 65 | 7 | 15 | | | | |
| 66 | 12 | 4 | | | | |
| 67 | 1 | 8 | | | | |
| 68 | 7 | 12 | | | | |
| 69 | 11 | 0 | | | | |
| 70 | 0 | 4 | | | | |
| 71 | 5 | 8 | | | | |
| 72 | 9 | 11 | | | | |
| 73 | 13 | 15 | | | | |
| 74 | 1 | 2 | | | | |
| 75 | 5 | 5 | | | | |
| 76 | 9 | 8 | | | | |
| 77 | 12 | 11 | | | | |
| 78 | 15 | 13 | | | | |
| 79 | 3 | 0 | | | | |
| 80 | 6 | 2 | | | | |
| 81 | 9 | 4 | | | | |
| 82 | 12 | 6 | | | | |
| 83 | 14 | 7 | | | | |
| 84 | 0 | 8 | | | | |
| 85 | 3 | 10 | | | | |
| 86 | 5 | 10 | | | | |
| 87 | 7 | 11 | | | | |
| 88 | 9 | 12 | | | | |
| 89 | 10 | 13 | | | | |
| 90 | 11 | 13 | | | | |
| 91 | 12 | 14 | | | | |
| 92 | 13 | 14 | | | | |
| 93 | 14 | 14 | | | | |
| 94 | 15 | | | | | |
| 95 | 0 | | | | | |
| 96 | 0 | | | | | |
| 97 | 1 | | | | | |
| 98 | 1 | | | | | |
| 99 | 1 | | | | | |
| 100 | 2 | | | | | |

TABLE 13

First and Last Carrier Indexes for each band

| | $C_{n1}$ | $C_{n2}$ |
|---|---|---|
| FCC | 3 | 102 |
| ARIB | 3 | 95 |
| CELENEC-A | 2 | 20 |
| CELENEC-B | 21 | 26 |
| CELENEC-C | 27 | 29 |
| CELENEC-BC | 21 | 29 |

Figure 11B:
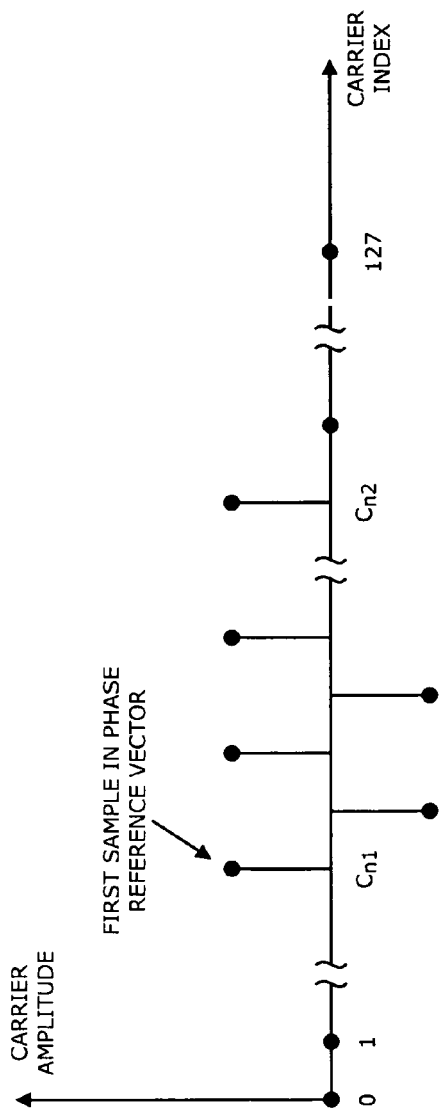
FIG. 11B is a diagram illustrating the carrier index numbers according to one embodiment.

FIG. 11B is a diagram illustrating the carrier index numbers according to one embodiment.

Figure 11C:
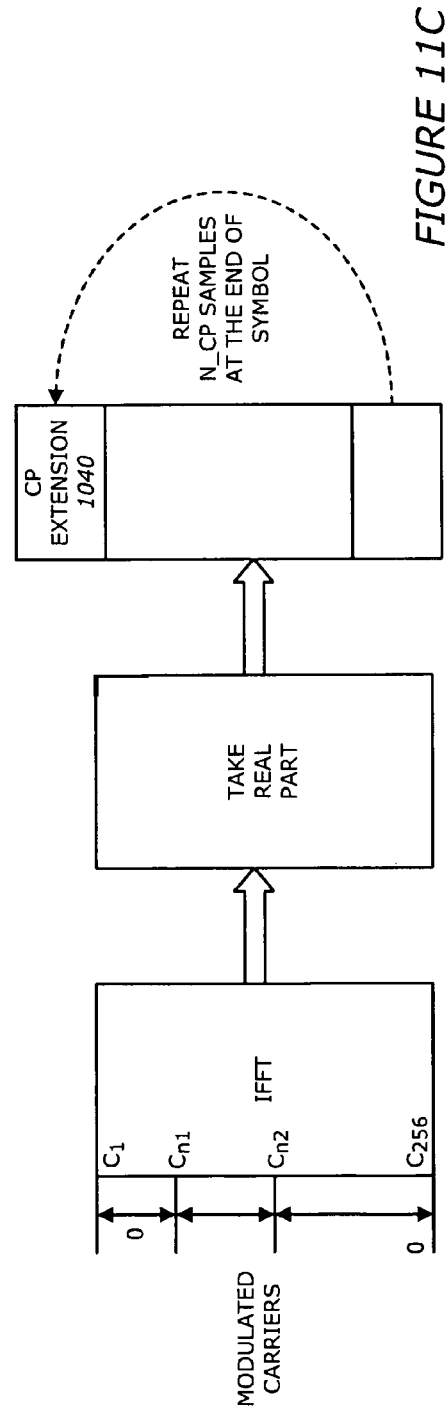
FIG. 11C is a diagram illustrating the input/output configuration according to one embodiment.

The IFFT 1030 may take the 256-point IFFT of the input vector and may generate the main 256 time domain OFDM words preceded by N_CP words of cyclic prefix. In other words, the last N_CP samples at the output of the IFFT 1030 may be taken and placed in front of symbol. The useful output may be the real part of the IFFT coefficients. FIG. 11C is a diagram illustrating the input/output configuration according to one embodiment. The first carrier $C_{n1}$ and the last carrier index $C_{n2}$ associated with each band may be given in Table 13.

Figure 12:
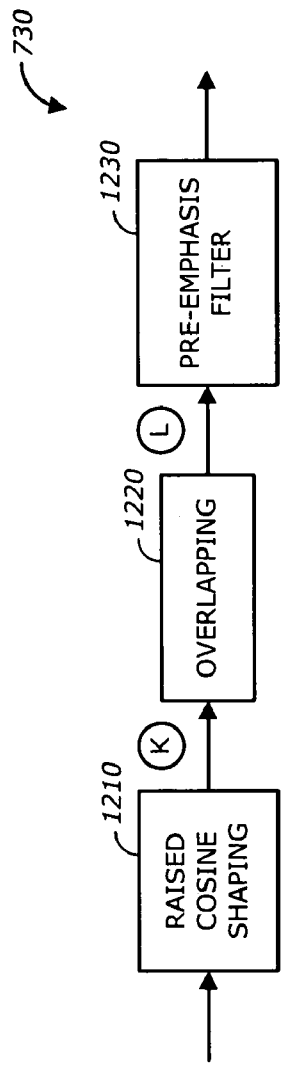
FIG. 12 is a diagram illustrating the PSD shaping module according to one embodiment.

FIG. 12 is a diagram illustrating the PSD shaping module 730 according to one embodiment. The PSD shaping module 730 includes a raised cosine shaping 1210, an overlapping 1220, and a pre-emphasis filter 1230.

Figure 13A:
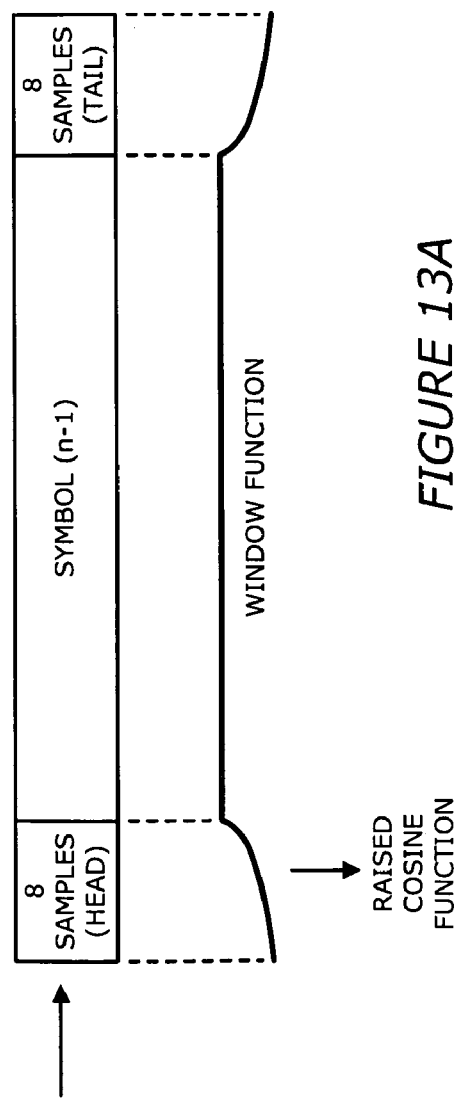
FIG. 13A is a diagram illustrating a raised cosine function according to one embodiment.
Figure 13B:
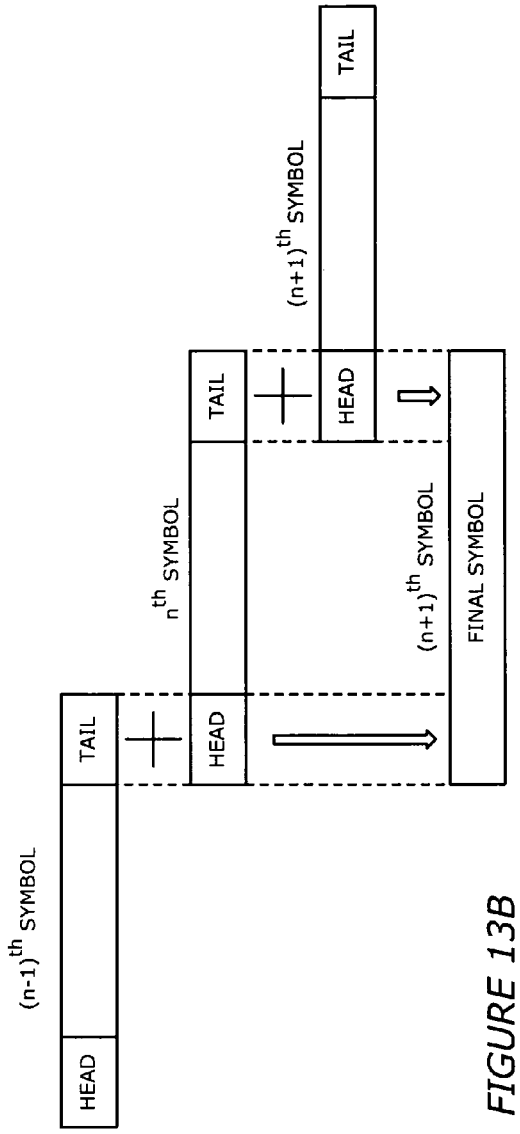
FIG. 13B is a diagram illustrating a overlapping and add operation according to one embodiment.

FIG. 13A is a diagram illustrating a raised cosine function according to one embodiment. FIG. 13B is a diagram illustrating a overlapping and add operation according to one embodiment.

In order to reduce the out of band emission and to reduce the spectral side lobe, a window function may be applied. In one embodiment, the Raised Cosine shaping 1210 may be applied to all the data symbols. Then the tails and heads of successive symbols may be overlapped and added together by the overlapping 1220. This process is described below. Each side of a symbol may be first shaped by the raised cosine function as shown in FIG. 13A.

The windowing function at each 8-sample boundary may be a Raised Cosine function and its values are given in Table 14. The window function may have a value equal to one at other samples. Then the 8 tail and 8 head shaped samples of the symbol from each side of symbol may be overlapped with the tail and head samples of adjacent symbols as shown in FIG. 13B. In other words, In order to construct the $n_{th}$ symbol, firstly its 8 head samples may be overlapped with the 8 tail samples of the $(n-1)_{th}$ symbol and its 8 tail samples may be overlapped with the 8 head samples of the $(n+1)_{th}$ symbol. Finally, the corresponding overlapped parts may be added together. Note that the head of the first symbol is overlapped with the tail of preamble. And the tail of last symbol may be sent out with no overlapping applied.

TABLE 14

The Raised Cosine Samples

| | Head samples | Tail samples |
|---|---|---|
| 1 | 0 | 0.9619 |
| 2 | 0.0381 | 0.8536 |
| 3 | 0.1464 | 0.6913 |
| 4 | 0.3087 | 0.5000 |
| 5 | 0.5000 | 0.3087 |
| 6 | 0.6913 | 0.1464 |
| 7 | 0.8536 | 0.0381 |
| 8 | 0.9619 | 0 |

Figure 14:
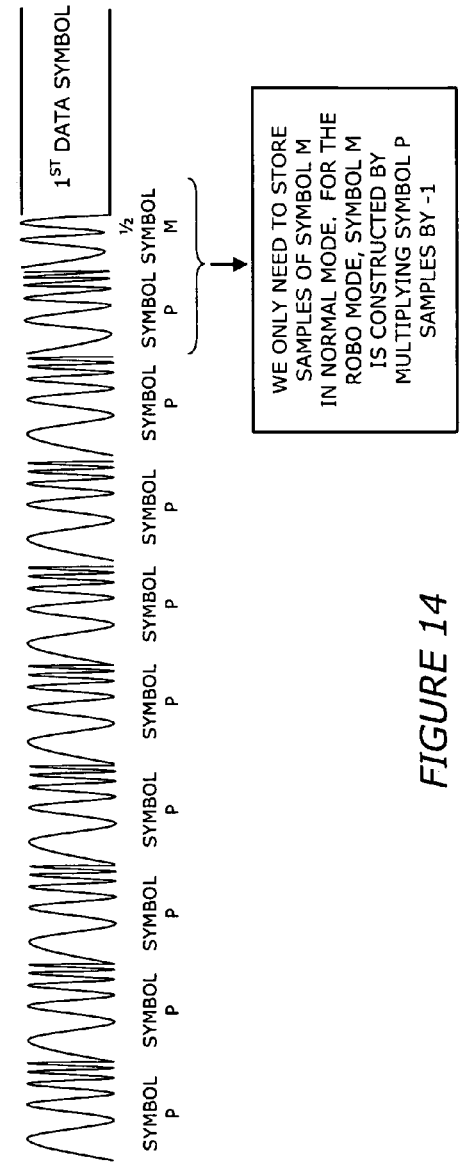
FIG. 14 is a diagram illustrating a preamble signal according to one embodiment.

FIG. 14 is a diagram illustrating a preamble signal according to one embodiment.

Memory locations may need to be allocated in the baseband to store the preamble samples. The preamble samples may be prepared in advance and download into the baseband memory during initialization period by the processor that implements the MAC layer. Each sample of preamble symbol may have an 8-bit length. The preamble signal that may be added to the beginning of each PHY frame may be shown in FIG. 14. It may include 8 symbols of type P and 1.5 symbols of type M. The total number of samples may be equal to 2432 samples. The first and the last 8 samples may be shaped according to Raised Cosine window. Note that the last 8 samples may be overlapped by the first 8 samples of the first data symbol. In practice we only need to store 256 sample of symbol P, 256 samples of symbol M, the first and the last 8 samples. Note that the symbol M may be different in Normal mode from that in the ROBO mode. In the ROBO mode, symbol M may be signed reversed of the P symbol, so there may be no extra storage required to store another symbol M for ROBO mode. In normal mode, the M symbol may have 90° phase shift from the P symbol.

Figure 15:
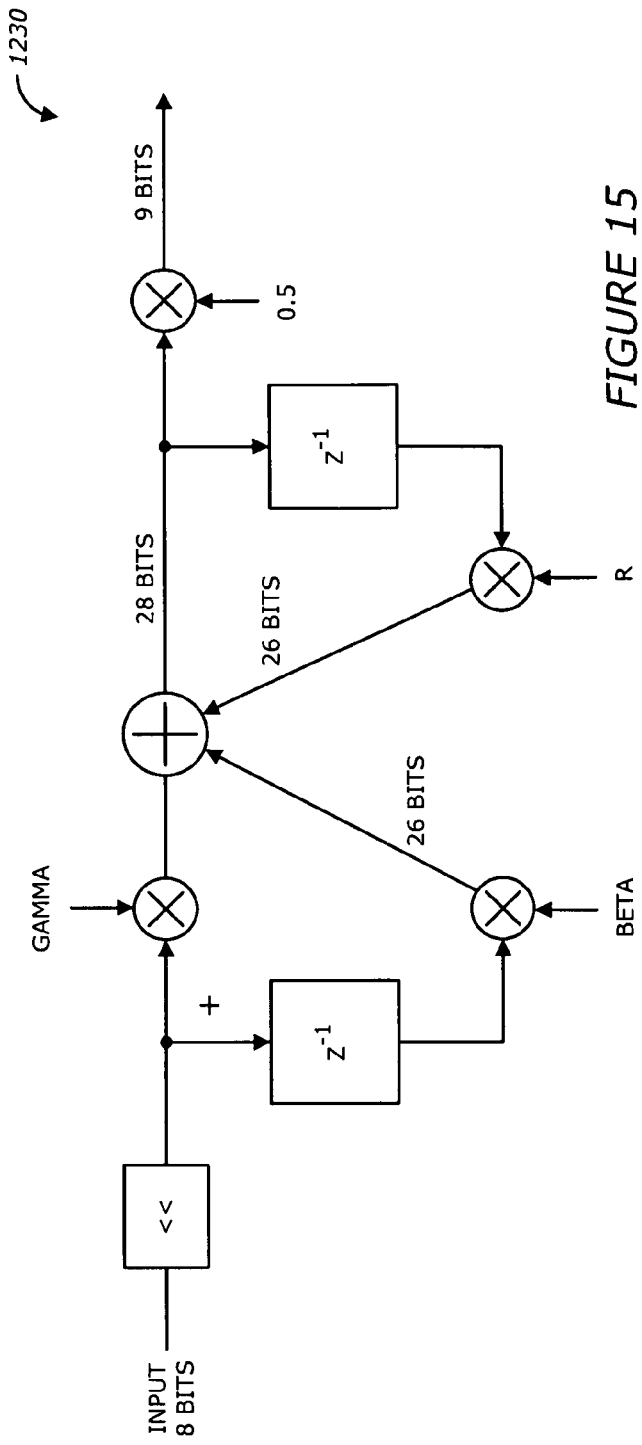
FIG. 15 is a diagram illustrating the pre-emphasis filter according to one embodiment.

FIG. 15 is a diagram illustrating the pre-emphasis filter 1230 according to one embodiment.

Time-Domain Pre-Emphasis Filter:

A time-domain pre-emphasis filter 1230 may be a linear equalization method where the transmit signal spectrum may be shaped to compensate for amplitude distortion. The purpose of this filter may be to provide frequency shaping to the transmit signal in order to compensate for attenuation introduced to the signal as it goes through the power line.

The pre-emphasis filter 1230 may be a first order recursive filter with transfer function of $H(z)=0.5*[(Gamma+Beta*z^{-1})/(1-R*z^{-1})]$. It may be specified with below deference equation:

$$y(n)=0.5*[Gamma*x(n)+Beta*x(n-1)+R*y(n-1)]$$

As shown, the pre-emphasis filter 1230 may have one zero and one pole. In this implementation Gamma, Beta, and R may be programmable and may be assigned 16-bit registers. The pre-emphasis filter 1230 may be the last block in the transmit path right before the output formatter 750. The pre-emphasis filter may have the following register requirements: an enable/disable bit to enable/bypass the pre-emphasis filter, a Gamma register (signed 16 bits): parameter to control the shape of the pre-emphasis filter, a Beta register (signed 16 bits): parameter to control the shape of the pre-emphasis filter, and an R register (signed 16 bits): parameter to control the shape of the pre-emphasis filter.

Figure 16:
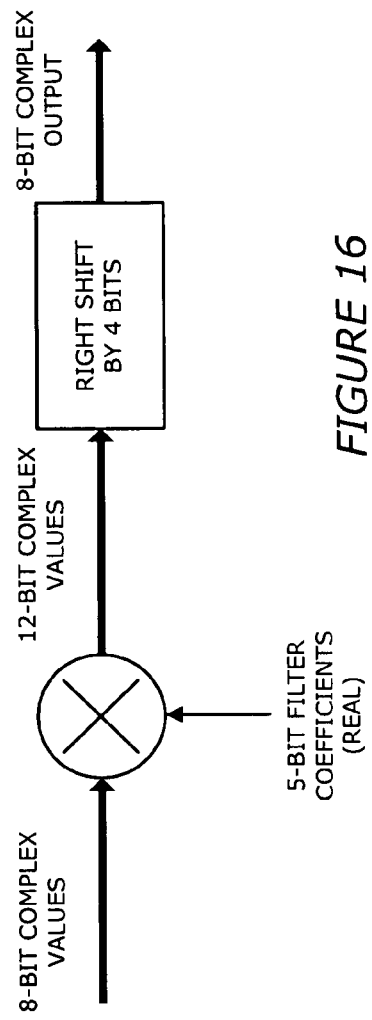
FIG. 16 is a diagram illustrating the pre-emphasis filter according to one embodiment.

Frequency Domain Pre-Emphasis Filter:

FIG. 16 is a diagram illustrating the pre-emphasis filter according to one embodiment. The purpose of this block may be to provide frequency shaping to the transmit signal in order to compensate for attenuation introduced to the signal as it goes through the power line.

The frequency-domain pre-emphasis filter may include of a multiplier that may multiply the complex frequency domain samples of an OFDM symbol with 128 real filter coefficients, then do four right shifts at the output. The filter coefficients may be 5 bits representing unsigned values from 0h to 10h. The filter coefficients may not be allowed to have values larger than 10h. The filter may multiply the first 128 frequency-domain complex samples of an OFDM symbol with the 128 real coefficients of the filter. The rest of the 128 frequency-domain samples of the OFDM symbol may be usually set to zero and may not be multiplied by the filter coefficients. As the block diagram below shows, the input complex samples may be 8 bits each while the filter coefficients may be 5 unsigned bits each. Since the maximum allowed value of any filter coefficients may be 10h, the output of the multiplication may be 12 bits (not 13 bits). The output may then be right shifted by 4 to get a final output of 8 bits that may be used as input to the IFFT.

The filter coefficient values may vary from 0 to 16, and since we do 4 right shifts at the output, it follows that the filter may provide the following attenuation for any of the 128 carriers:

| Scaling factor | attenuation in dB |
|---|---|
| 16/16 | 0 dB |
| 15/16 | −0.53 dB |
| 14/16 | −1.16 dB |
| 13/16 | −1.8 dB |
| 12/16 | −2.5 dB |
| 11/16 | −3.25 dB |
| 10/16 | −4 dB |
| 9/16 | −5 dB |
| 8/16 | −6 dB |
| 7/16 | −7.2 dB |
| 6/16 | −8.5 dB |
| 5/16 | −10.1 dB |
| 4/16 | −12 dB |
| 3/16 | −14.5 dB |
| 2/16 | −18 dB |
| 1/16 | −24 dB |
| 0/16 | −infinite |

The following registers may be needed to control the frequency-domain pre-emphasis filter: Enable/Disable bit: Allows for enabling/disabling the filter.

Transmitter (TX) P and D Scaler:

In order to control the transmitted power level of P and M in relation to power level of data two scalers may be implemented in the transmitter: a Data scaler to scale the data, and a P/M scaler to control the levels of the P & M that we are now generating from the frequency domain using the IFFT. Both scalers may be described below. On the receiver path, no scaling may be needed.

Figure 17A:
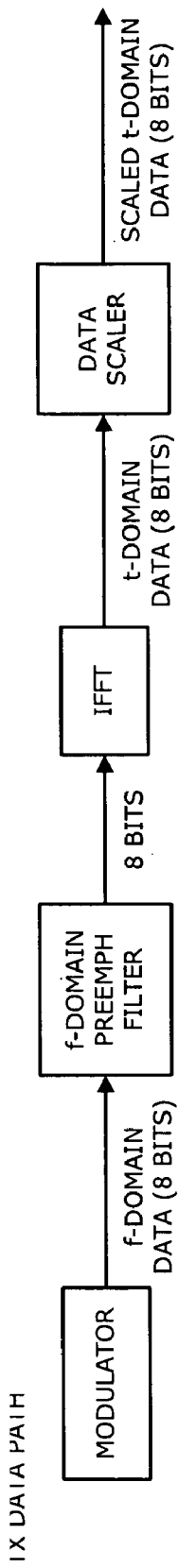
FIG. 17A is a diagram illustrating a data scaler on the transmitter data path according to one embodiment.
Figure 17B:
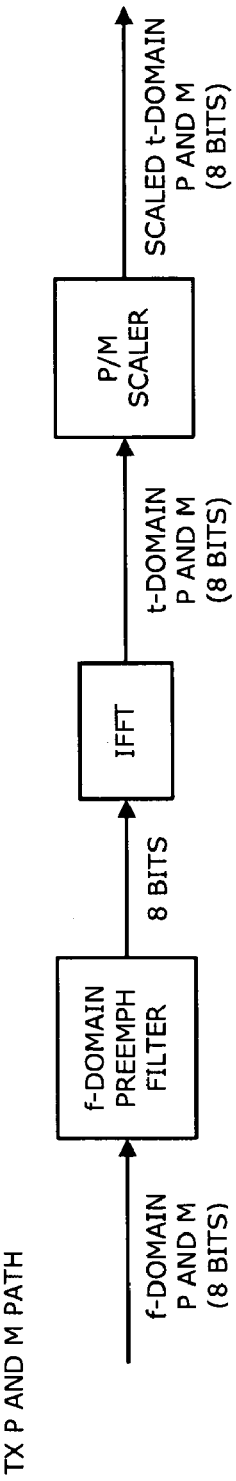
FIG. 17B is a diagram illustrating a P and M scaler on the transmitter data path according to one embodiment.
Figure 17C:
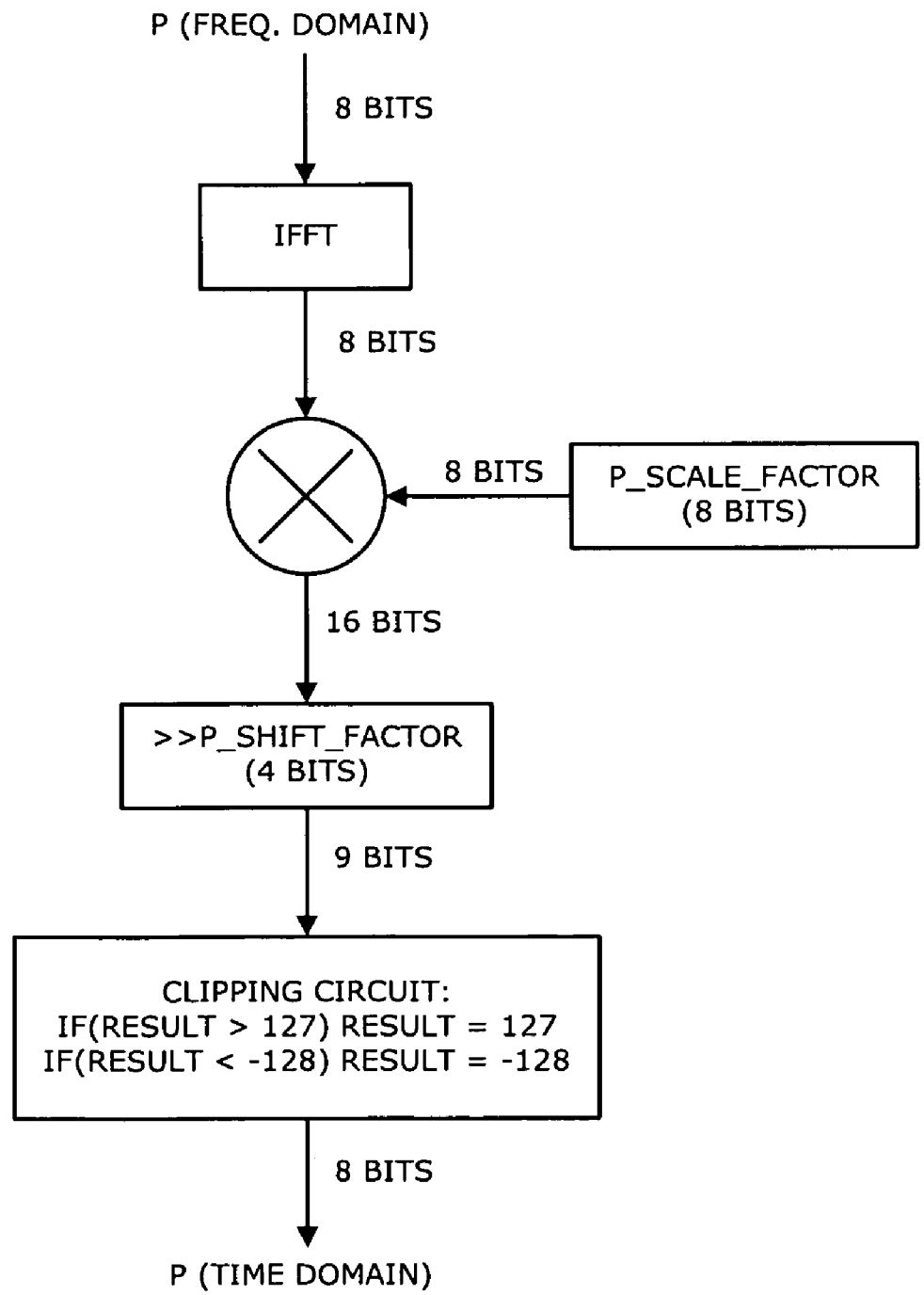
FIG. 17C is a diagram illustrating a scaler for frequency-domain P and M signals according to one embodiment.

FIG. 17A is a diagram illustrating a data scaler on the transmitter data path according to one embodiment. FIG. 17B is a diagram illustrating a P and M scaler on the transmitter data path according to one embodiment. FIG. 17C is a diagram illustrating a scaler for frequency-domain P and M signals according to one embodiment. FIGS. 17A and 17B are provided to show how the 4-bit sync reference may be generated and scaled. The P/M scaler is used to scale IFFT output of frequency-domain P and M so that their levels may be as close as possible to original time-domain P & M. Once that is accomplished, the data scaler is used to achieve the desired P/Data RMS ratio. In what follows, the P/M scaler is described first, followed by the data scaler, which may have an identical architecture.

FIG. 17C shows how the IFFT output of frequency-domain P and M may be scaled so that their levels may be as close as possible to original time-domain P & M. This block may be called the "P/M Scaler". The table lists the values for P_scale_ factor and P_shift_factor registers for the different wideband and narrowband standards.

The data scaler may have identical block to the P/M scaler except that P_scale_factor is renamed to Data_scale_factor, and P_shift_factor is renamed to Data_shift_factor, where both may remain 8 bits each. The table shows the default values for the data scalers for the different standards.

Figure 18:
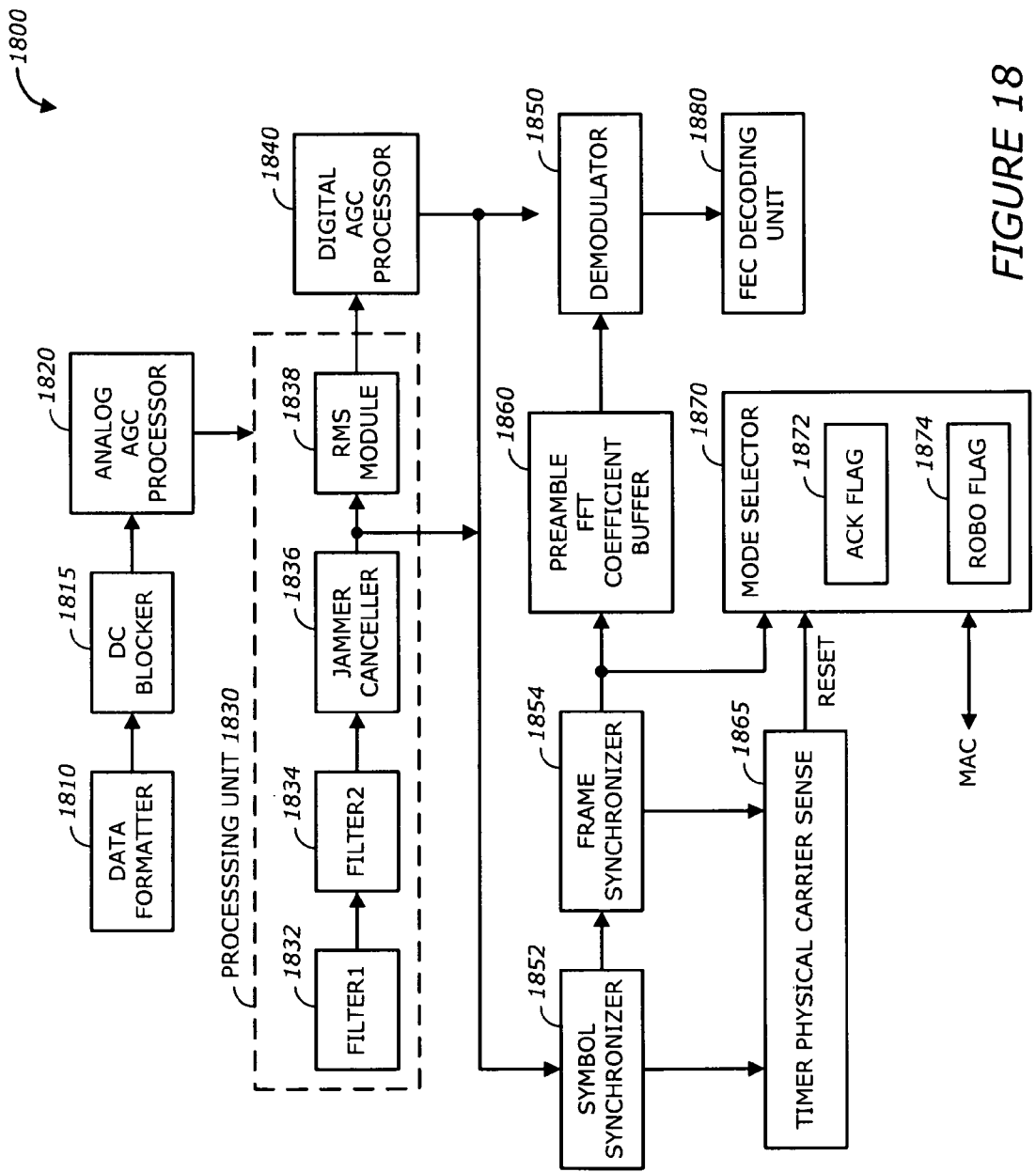
FIG. 18 is a diagram illustrating a receiver according to one embodiment.

FIG. 18 is a diagram illustrating a receiver 1800 according to one embodiment. The receiver 1800 includes a data formatter 1810, a direct current (DC) blocker 1815, an analog automatic gain control (AGC) processor 1820, a processing unit 1830, a digital AGC processor 1840, a demodulator 1850, a symbol synchronizer 1852, a frame synchronizer 1854, a preamble FFT coefficient buffer 1860, a mode detector 1870, and a FEC decoding unit 1880. It is noted that the receiver 1880 may include more or less than the above elements. In addition, any one of the above elements may be implemented by hardware, software, firmware, or any combination of hardware, software, and firmware.

Figure 19:
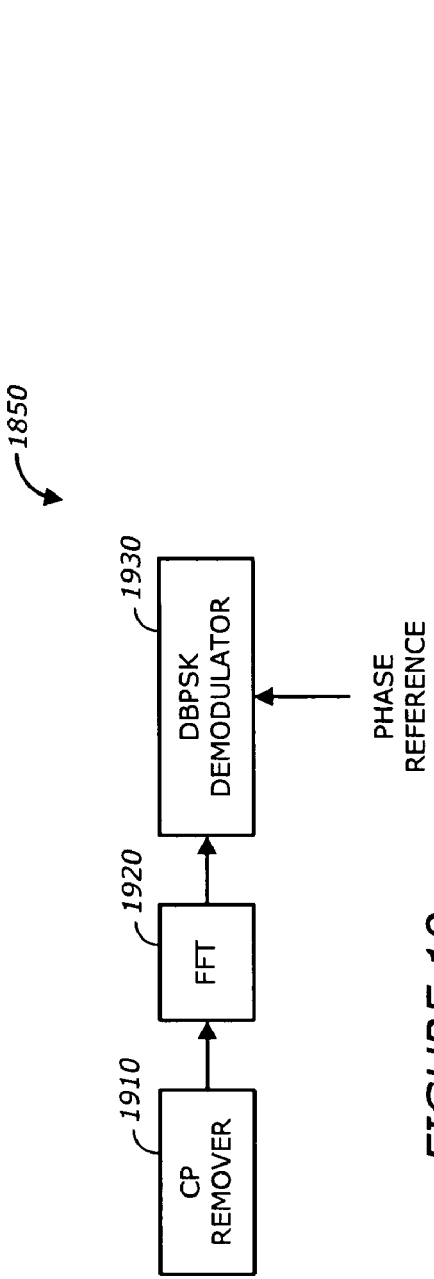
FIG. 19 is a diagram illustrating the demodulator according to one embodiment.

FIG. 19 is a diagram illustrating the demodulator 1850 according to one embodiment. The demodulator 1850 includes a cyclic prefix (CP) remover 1910, a FFT processor 1920, and a DBPSK demodulator 1930.

Figure 20:
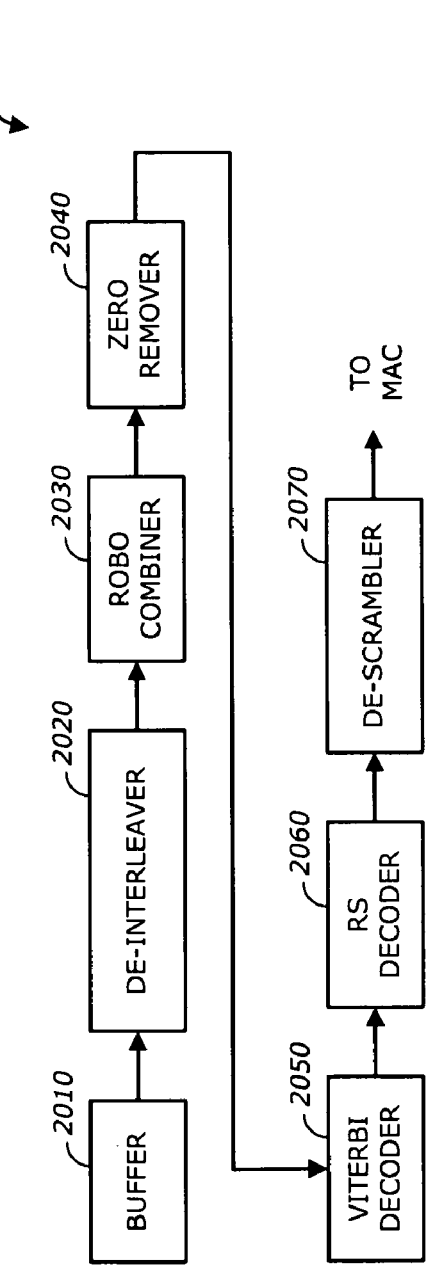
FIG. 20 is a diagram illustrating the FEC decoding unit according to one embodiment.

FIG. 20 is a diagram illustrating the FEC decoding unit 1880 according to one embodiment. The FEC decoding unit 1880 includes a buffer 2010, a de-interleaver 2020, a ROBO combiner 2030, a zero remover 2040, a Viterbi decoder 2050, a RS decoder 2060, and a descrambler 2070. It is noted that the FEC decoding unit 1880 may include more or less than the above elements. In addition, any one of the above elements may be implemented by hardware, software, firmware, or any combination of hardware, software, and firmware.

On the receiver side, the PHY layer may receive its input samples from the power line and may hand the demodulated data bits over to the MAC layer. The processing unit 1830 may include a first infinite impulse response (IIR) filter 1832, a second IIR filter 1834, a jammer canceller 1836, and a root mean square (RMS) module 1838. The jammer canceller 1836 removes interference or a jamming signal in the input signal. The symbol synchronizer 1852 and the frame synchronizer 1854 may be used for preamble (ACK signal) detection, symbol and frame synchronization. The frame synchronizer 1854 and the preamble FFT coefficient buffer 1860 may be used to perform the initial preamble phase and the channel estimation, respectively.

The synchronizers 1852 and 1854 and the jammer canceller 1836 may be ON when the system is in the "Receive" mode. If the jammer or interfering signal may be present in the channel and detected, a switch may be set so that the signal may be taken from the output of the jammer canceller 1836. The jammer detector in the jammer canceller 1836 may do this automatically. The mode detector 1870 detects the mode of operation and sets an ACK flag 1872 or a ROBO flag 1874 as appropriate.

Two different synchronizer circuits, one for FCC, ARIB and CENELEC bands (Wideband OFDM) and another for CENELEC B, C and BC (Narrow band OFDM), may be used for different bands. The tasks for synchronizers may be the detection of preamble and obtaining the start of preamble symbol (symbol synchronizer) and the start of data symbol (frame synchronizer). As soon as the start of data symbol may be found, a switch may be moved to place the CP remover in the demodulator 1850 (FIG. 19) in the signal path. At the same time a timer 1865 may be enabled to generate the Physical Carrier Sense (PCS) signal. This signal may be high for the entire frame period. It may be at the end of PCS signal that the ACK flag 1872 and the ROBO flag 1874 are reset. Note that same waveforms may be used for ACK signaling and therefore as soon as the preamble is detected the ACK flag 1872 may be set. The value of this flag may be read by the MAC software and may be reset at the end of PCS signal. Note that the frame synchronizer 1854 may also detect if the PHY frame may be in ROBO mode or in Normal mode accordingly set/reset the ROBO flag 1874.

Once the symbol synchronizer identifies the start of preamble symbols, the initial channel estimator may be activated. At this time a switch may be set since there may be no cyclic prefix extension for preamble symbols. This block may measure the reference phase from the preamble. It may also measure the channel quality at each frequency bin. The channel estimator may also estimate the SNR for each carrier.

The ROBO flag 1874 may select the position of a switch in the FEC decoding unit 1880. Depending on the preamble waveform, the frame synchronizer 1854 may identify if the frame is in ROBO mode or in Normal Mode and the switch in the FEC decoding unit 1880 is set accordingly.

Figure 21:
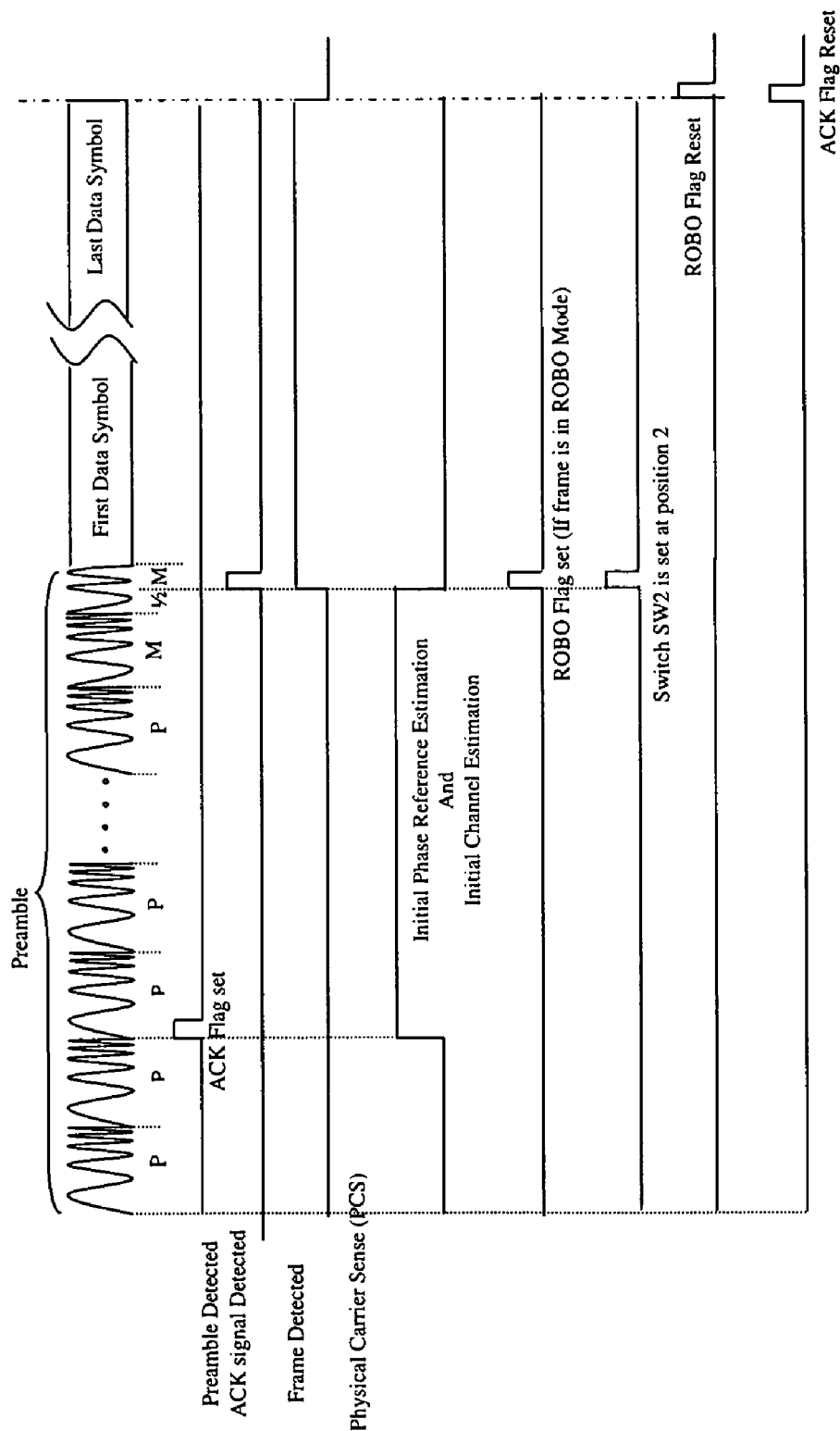
FIG. 21 is a diagram illustrating timings associated with events in the receiver according to one embodiment.

FIG. 21 is a diagram illustrating timings associated with events in the receiver according to one embodiment.

Figure 22:
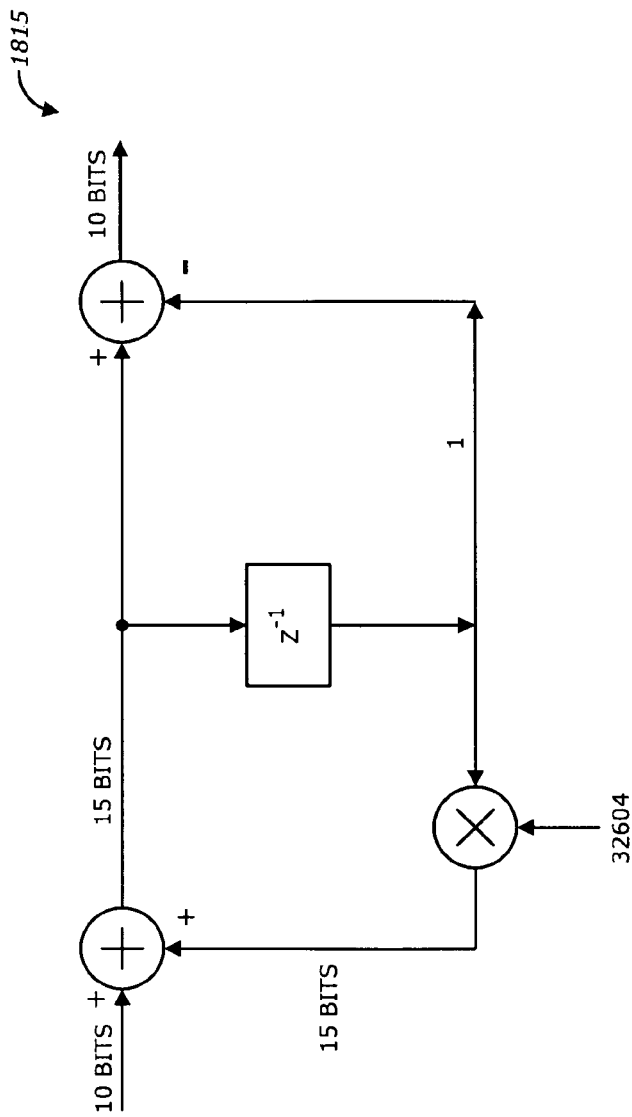
FIG. 22 is a diagram illustrating the DC blocker according to one embodiment.

The data formatter 1810 may take the data bits from the analog-to-digital converter (ADC) and may perform tasks including, scaling, and mapping to convenient signed value representation. The DC blocker 1815 may be used to remove the DC component of incoming data. Since A/D converters and analog front-end circuitry may not be expected to be totally DC free, this filter may remove the DC residual. FIG. 22 is a diagram illustrating the DC blocker 1815 according to one embodiment. The DC blocker 1815 may be a first order recursive filter with transfer function of $H(z)=1-z^{-1}/1-Az^{-1}$. It may be specified with the deference equation $y(n)=x(n)-x(n-1)+Ay(n-1)$. DC blocker may have a zero at DC ($z=1$) and a pole near DC at $z=A$. In order to have the pole and zero cancel each other A may be selected as close as possible to unit circle. In one embodiment, $A=0.995*2^{15}=32604$. The DC blocker 1815 may be the first block in receiver path before jammer canceller 1836. An enable/disable register may be allocated for the DC blocker 1815.

Figure 23:
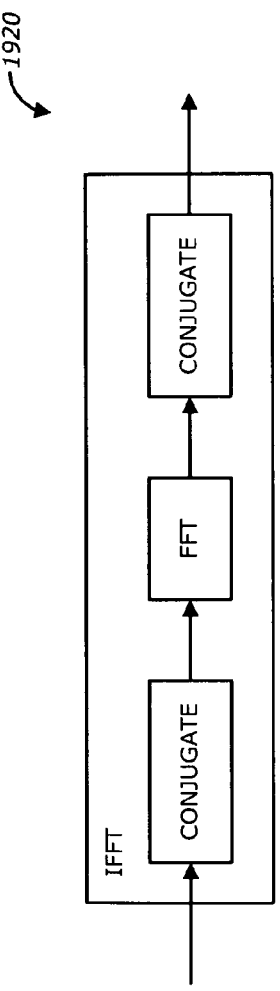
FIG. 23 is a diagram illustrating the FFT according to one embodiment.

FIG. 23 is a diagram illustrating the FFT 1920 according to one embodiment. The same structure as used for the IFFT in the transmitter is used for FFT as well.

Figure 24:
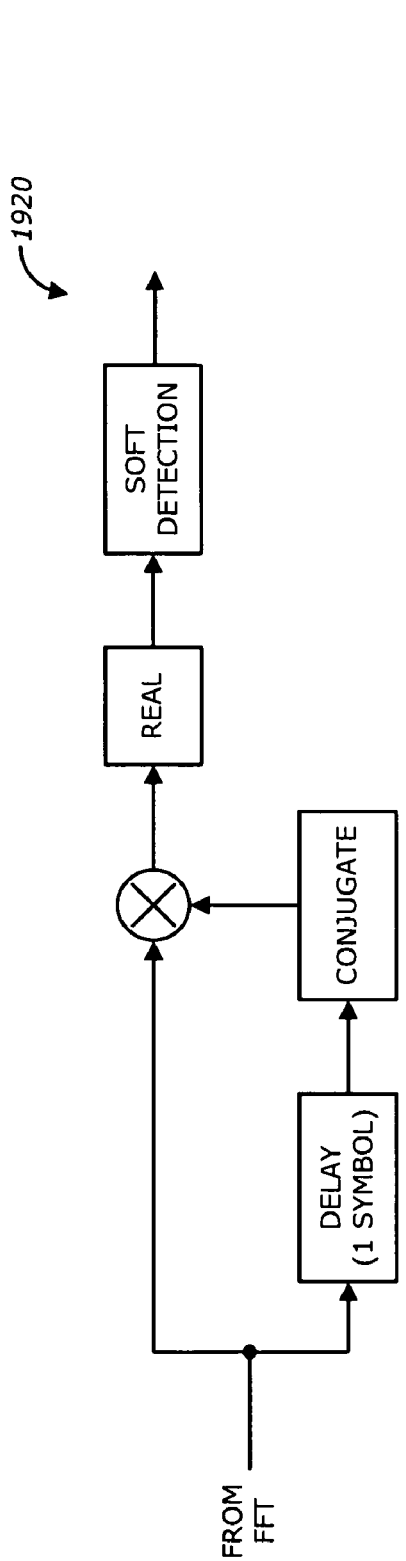
FIG. 24 is a diagram illustrating the DBPSK demodulator according to one embodiment.

FIG. 24 is a diagram illustrating the DBPSK demodulator 1930 according to one embodiment. The phase difference between carriers over successive symbols may be estimated after the FFT of the current symbol may be multiplied by the conjugate values of the FFT of the previous symbol. The size of the signal at each node in FIG. 4.15 may be equal to the number of carriers (Ncarr). The real value of the signal at the output of multiplier may be taken and quantized appropriately by soft detection block. Each bit (carried by each carrier) may be represented by an integer number. The value of this number may depend on the reliability of the bit. The length of this integer number may be provided in fixed-point implementation.

The bit de-interleaver 2020 may reverse the mappings described in the transmitter section.

Figure 25:
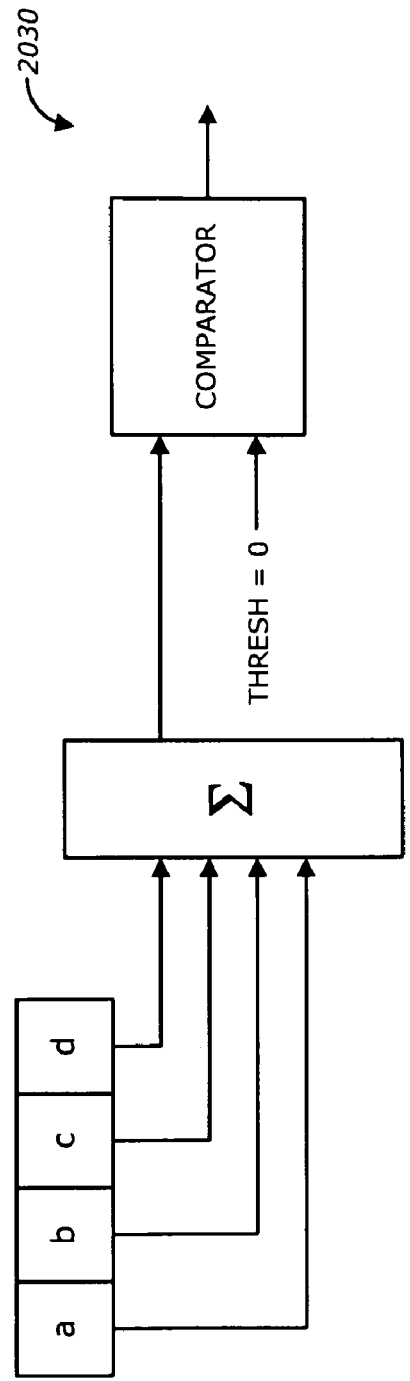
FIG. 25 is a diagram illustrating the ROBO combiner/decoder according to one embodiment.

FIG. 25 is a diagram illustrating the ROBO combiner/decoder 2030 according to one embodiment. In ROBO mode, the encoded data may be extended 4 times by parity bits. For the repeat code, the soft values for each demodulated carrier are obtained. Then all the four values associated with one data bit may be averaged prior to hard decoding. The errors at the output of Viterbi decoder tend to occur in a burst fashion. To correct these burst errors a RS code may be concatenated with convolutional code.

Figure 26:
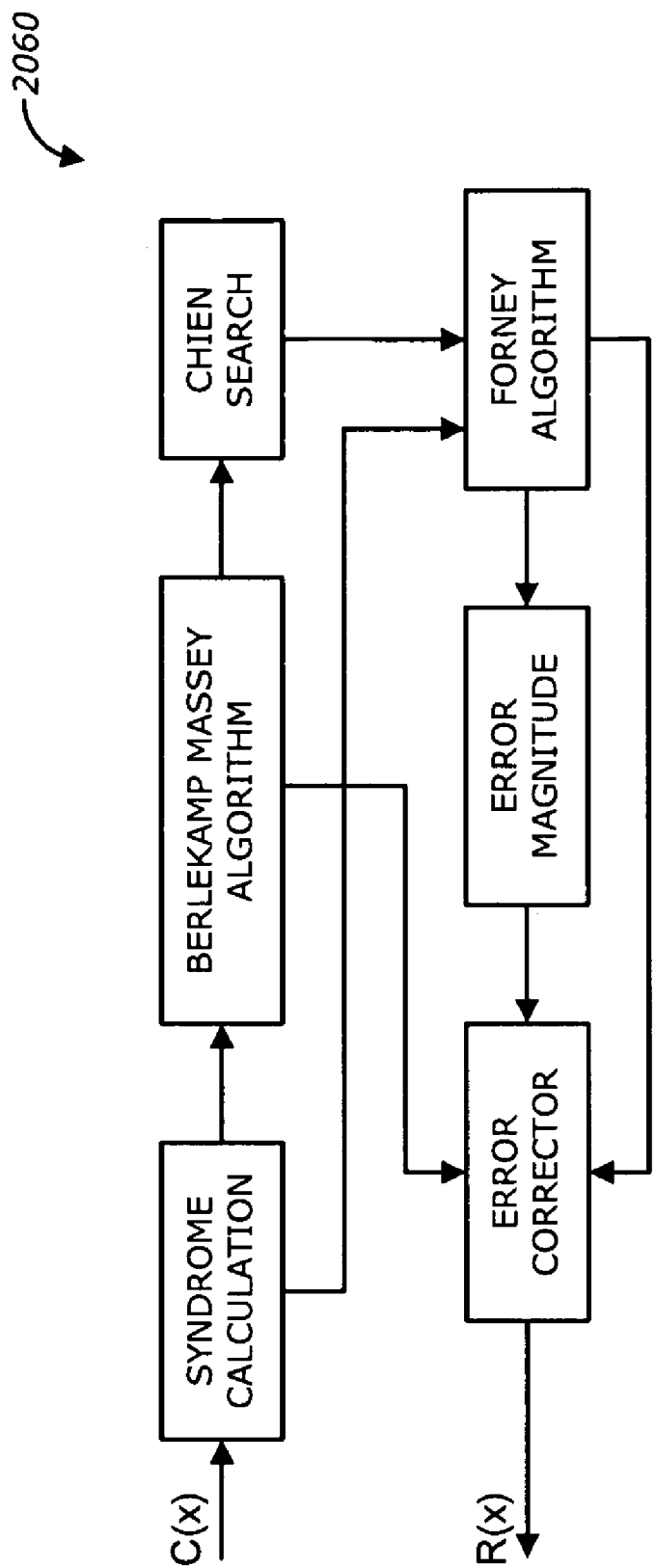
FIG. 26 is a diagram illustrating the RS decoder according to one embodiment.

FIG. 26 is a diagram illustrating the RS decoder 2060 according to one embodiment.

The de-scrambler 2070 may reverse the scrambling action, done on the source information bits in the transmitter.

In digital communication system to increase the reliability of the data transmission the errors caused by the channel should be statistically independent. However, there are channels that exhibit bursty error characteristics. One example is the class of channels characterized by multipath and fading. Signal fading due to time-variant multipath propagation often causes the signal to fall below the noise level, thus resulting in a large number of errors. An effective method for dealing with burst error channels is to interleave the coded data in such a way that bursty channel is transformed into a channel having independent errors. Thus a code designed for independent channel errors is used. Particularly, interleaving is very helpful in conjunction with OFDM where interleaving can be performed in frequency domain (by mapping to different non-contiguous subcarriers) as well as time domain (mapping data to different symbols) achieving time and frequency diversity. The present interleaving scheme uses a linear block interleaver and achieves the same performance of a random interleaver using a simpler architecture with less computation.

Figure 27:
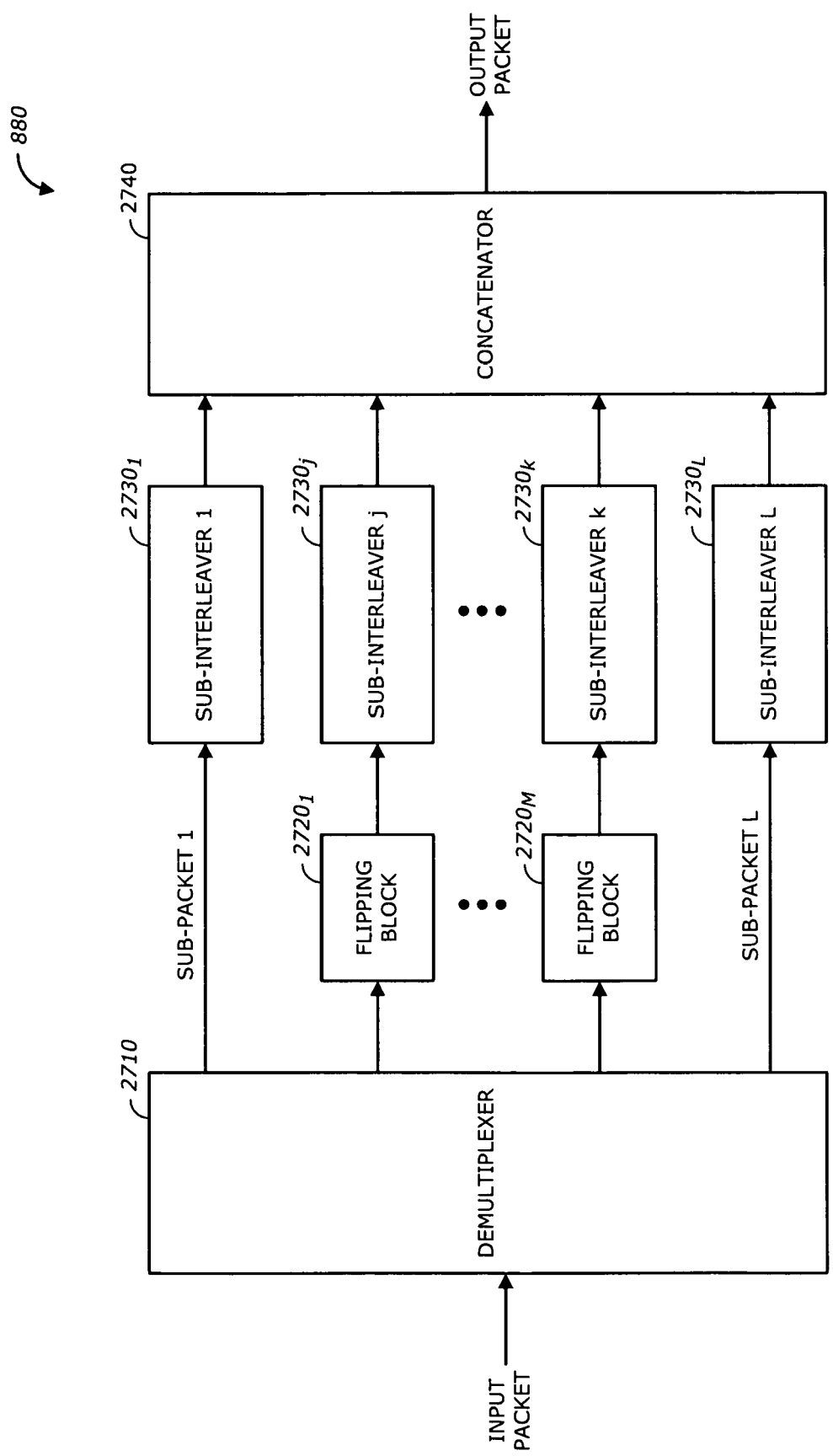
FIG. 27 is a diagram illustrating the interleaver according to one embodiment.

FIG. 27 is a diagram illustrating the interleaver 880 shown in FIG. 8 according to one embodiment. The interleaver 880 includes a demultiplexer 2710, M flipping blocks $2720_1$ to $2720_M$, L sub-interleavers $2730_1$ to $2730_L$, and a concatenator 2740. M and L are integers where M≦L. In one embodiment, L=4 and M=2. It is noted that the interleaver 880 may include more or less than the above elements. In addition, any one of the above elements may be implemented by a combination of hardware and software, or hardware and firmware.

The demultiplexer 2710 demultiplexes an input packet having N bits into L sub-packets on L branches. The demultiplexer 2710 may be a data steering circuit that steers data from one input to multiple outputs. The M flipping blocks $2720_1$ to $2720_M$ have the same architecture and flip M of the L sub-packets. Flipping may include reversing the bit order of the sub-packet from end to beginning. The L sub-interleavers $2730_1$ to $2730_L$ have identical architecture and interleave the (L-M) sub-packets and the M flipped sub-packets. The concatenator 2740 concatenates the interleaved sub-packets to form an output packet. In one embodiment where L=4 and M=2, the two flipping blocks $2720_1$ to $2720_2$ may correspond to branches 2 and 3.

The demultiplexer 2710 may operate in a normal mode and a robust mode. In normal mode, the input data bits are applied to each branch alternatively. This means that the first data bit is applied to the first interleaver branch; the second bit is applied to the second branch and so on so forth. In other words, the input packet is switched at a rate of every L bits for each of the L branches. In robust mode, the input packet may be repeated L times (e.g., L=4 hereby the repetition code four is described). However the data for K of the L branches may be read from bit number $N_0$ (assuming the first number is 1) and the reading is wrapped around at the end of the packet. This means that when the end of packet is reached, it starts the reading from the beginning and stops at bit number $N_0-1$. In one embodiment where L=4 and M=2, $N_0=233$, and the K branches correspond to the third and the fourth branches.

Figure 28:
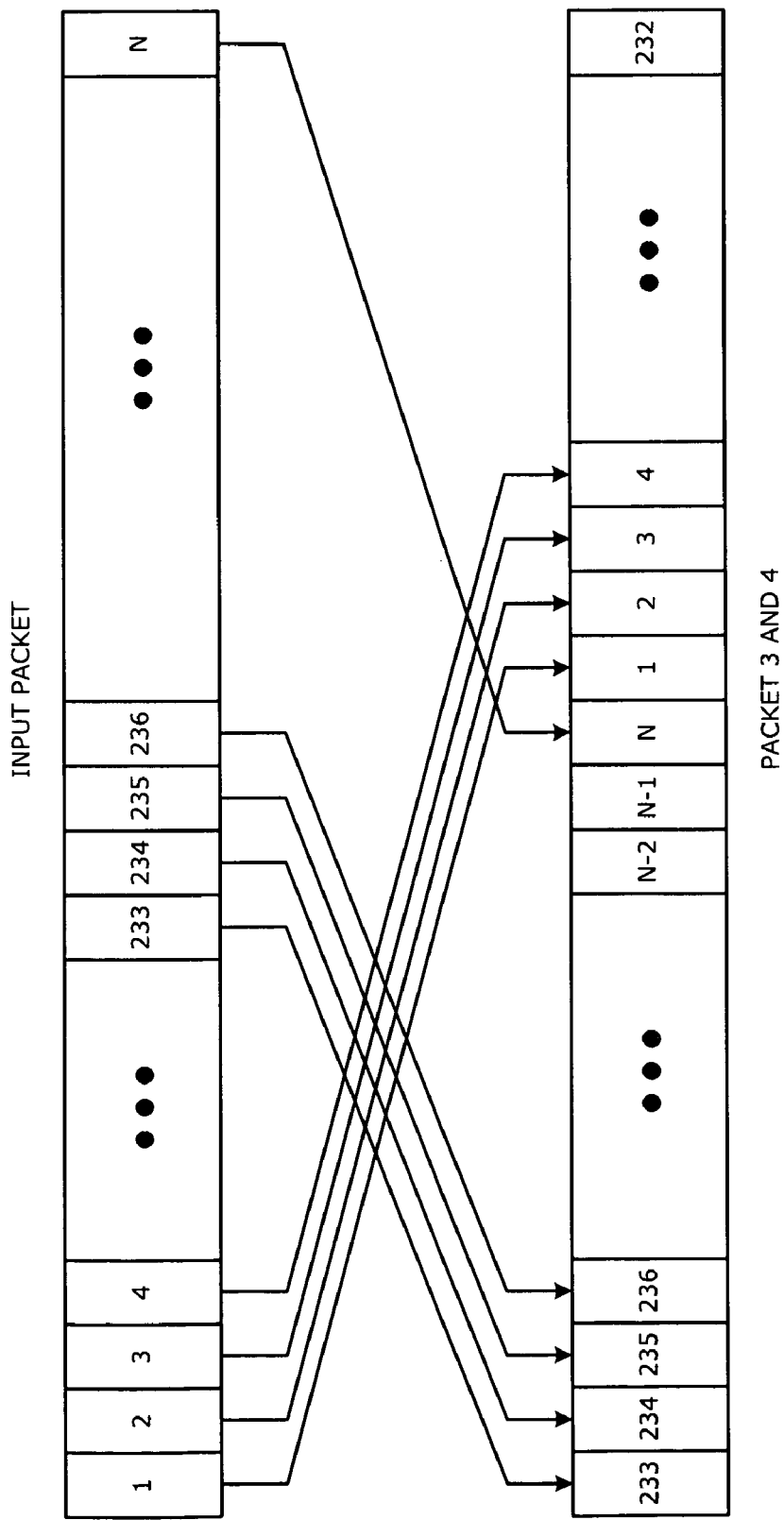
FIG. 28 is a diagram illustrating the reading of the K branches from $N_0$ according to one embodiment.

FIG. 28 is a diagram illustrating the reading of the K branches from $N_0$ according to one embodiment. In the K of the L branches the input packet is read from bit $N_0$ of the N bits in a wrap-around manner. For example, for L=4 and M=2, $N_0=233$, and the K branches correspond to the third and the fourth branches, the reading starts from bit 233 to N and then 1 to 232.

Each of the L sub-interleavers $2730_1$ to $2730_L$ interleaves the input sub-packet in a helical scan manner. Each of the L sub-interleavers $2730_1$ to $2730_L$ writes the sub-packet row-by-row in a matrix having R rows and C columns and reads the sub-packet from the matrix in a helical scan manner. C is equal to a product of number of symbols and number of carriers divided by a constant. In one embodiment, R=10 and the constant is equal to 40. For this embodiment, the number of columns C=Number of symbols*Number of carries/40. The number of columns and rows for different bands may be given in Table 15.

TABLE 15

Number of sub-interleaver rows and columns

| | No. of Rows | No. of Columns |
|---|---|---|
| FCC | 10 | 100 |
| ARIB | 10 | 93 |
| CENELEC A | 10 | 76 |
| CENELEC B | 10 | 48 |
| CENELEC C | 10 | 48 |
| CENELEC BC | 10 | 72 |

Figure 29:
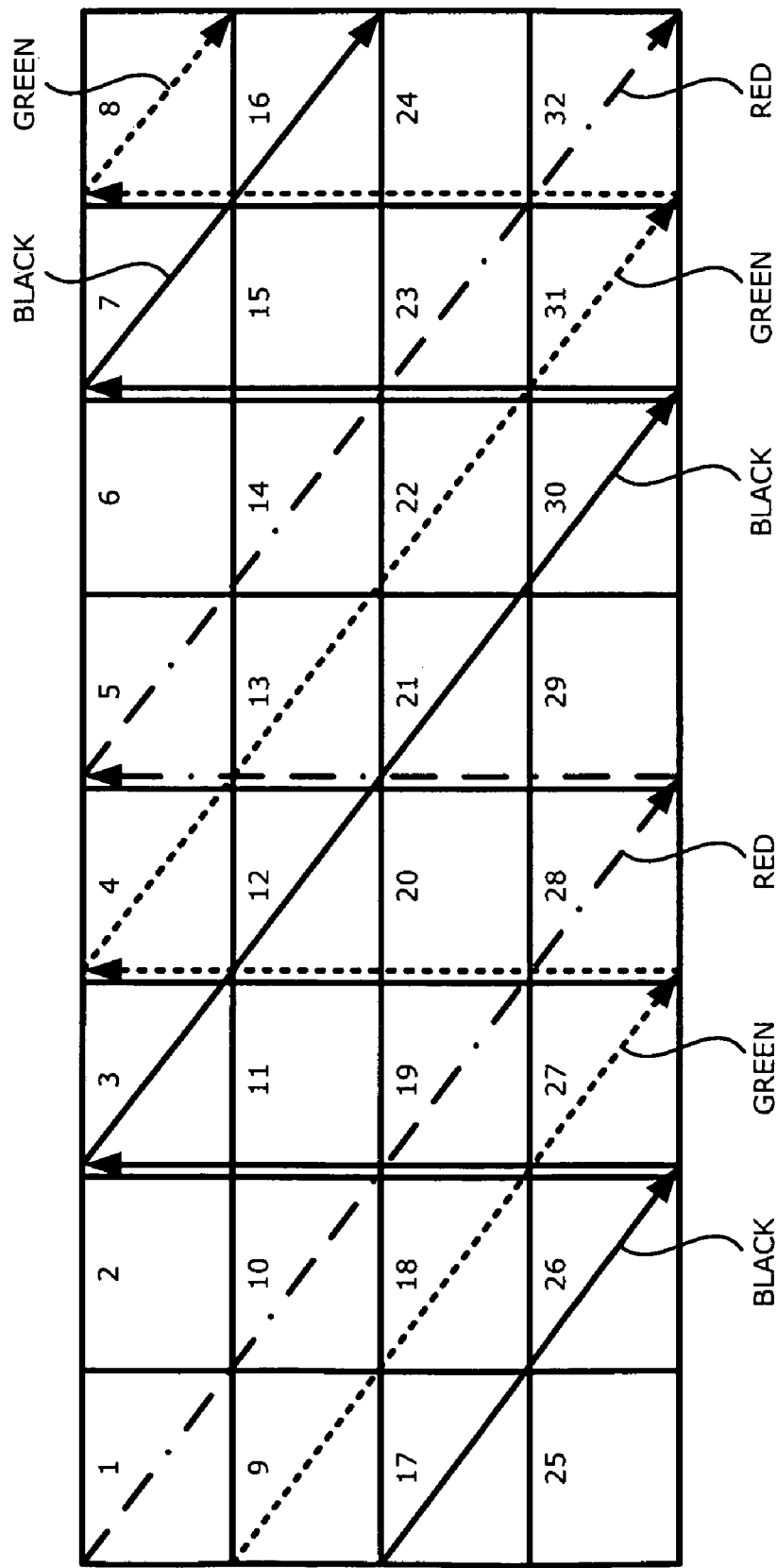
FIG. 29 is a diagram illustrating the reading in a helical scan manner according to one embodiment.

FIG. 29 is a diagram illustrating the reading in a helical scan manner according to one embodiment. For illustration purposes; consider the input array as [1,2,3,4,5,6,7,8,9,10,11, 12,13,14,15,16,17,18,19,20,21,22,23,24,25,26,27,28,29,30,31,32

Reading diagonal wise, starting from index position (0,0), going through traces Red, Green, Black, etc, traces, the output array may be given by: [1,10,19,28,5,14,23,32,9,18,27,4,13, 22,31,8,17,26,3,12,21,30,7,16,25,2,11,20,29,6,15,24]

Note that the input packet to the second and third interleavers may be flipped. In other words, the packet may be written from the end of array A typical C code to implement one of the sub-interleavers $2730_1$ to $2730_L$ is given below:

```
R = 10; //Number of rows
C = Ns * Ncarr / 40; //Number of columns
i=0;
//writing into the memory row by row
for (n=0;n<R;n++)
    {
        for (m=0;m<C;m++)
        {
            a[n][m]= x[i]; // x is the input array
            i = i + 1;
        }
    }
//reading the memory diagonal wise
i=0;
for (n=0;n<R;n++)
{
    k = n;
    for (m = 0;m < C; m++)
    {
        x[i] = a[k][m];
        k = (k + 1) % R;
        i = i + 1;} }
```

The outputs of the sub-interleavers $2730_1$ to $2730_L$ may be finally concatenated by the concatenator 2740. The concatenator 2740 concatenates the L sub-packets on a sub-packet basis which means that the whole output packet of the first interleaver 2730₁ may be sent first, the whole output packet of the second interleaver 2730₂ may be sent second, and so on so forth (i.e., bit by bit alternation may not be applied to the output).

Elements of one embodiment may be implemented by hardware, firmware, software or any combination thereof. The term hardware generally refers to an element having a physical structure such as electronic, electromagnetic, optical, electro-optical, mechanical, electromechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EPROM). Examples of firmware may include microcode, writable control store, micro-programmed structure. When implemented in software or firmware, the elements of an embodiment are essentially the code segments to perform the necessary tasks. The software/firmware may include the actual code to carry out the operations described in one embodiment, or code that emulates or simulates the operations.

The program or code segments can be stored in a processor or machine accessible medium. The "processor readable or accessible medium" or "machine readable or accessible medium" may include any medium that may store, transmit, receive, or transfer information. Examples of the processor readable or machine accessible medium that may store include a storage medium, an electronic circuit, a semiconductor memory device, a read only memory (ROM), a flash memory, an erasable programmable ROM (EPROM), a floppy diskette, a compact disk (CD) ROM, an optical disk, a hard disk, etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus comprising:
   a demultiplexer to demultiplex an input packet having N bits into L sub-packets on L branches;
   M flipping blocks coupled to the demultiplexer to flip M of the L sub-packets, M being smaller than L;
   L sub-interleaves coupled to the demultiplexer and the M flipping blocks to interleave the (L-M) sub-packets and the M flipped sub-packets; and
   a concatenate coupled to the L sub-interleaves to concatenate the interleaved sub-packets to form an output packet; wherein L and M are integers greater than or equal to one.

2. The apparatus of claim 1 wherein the demultiplexer operates in a normal mode and a robust mode.

3. The apparatus of claim 2 wherein in the normal mode the input packet is switched at a rate of every L bits for each of the L branches.

4. The apparatus of claim 2 wherein in the robust mode the input packet is repeated L times.

5. The apparatus of claim 4 wherein in K of the L branches the input packet is read from bit $N_0$ of the N bits in a wrap-around manner.

6. The apparatus of claim 1 wherein each of the M flipping blocks reverses a bit order of one of the L sub-packets from end to beginning.

7. The apparatus of claim 1 wherein each of the L sub-interleavers writes the sub-packet row-by-row in a matrix having R rows and C columns and reads the sub-packet from the matrix in a helical scan manner.

8. The apparatus of claim 7 wherein C is equal to a product of number of symbols and number of carriers divided by a constant.

9. The apparatus of claim 8 wherein R is equal to 10 and the constant is equal to 40.

10. The apparatus of claim 1 wherein the concatenator concatenates the L sub-packets on a sub-packet basis.

11. A method comprising: demultiplexing an input packet having N bits into L sub-packets on L branches; flipping M of the L sub-packets, M being smaller than L; interleaving the (L-M) sub-packets and the M flipped sub-packets; and concatenating the interleaved sub-packets to form an output packet; wherein L and M are integers greater than or equal to one.

12. The method of claim 11 wherein demultiplexing comprises operating in a normal mode and a robust mode.

13. The method of claim 12 wherein in the normal mode the input packet is switched at a rate of every L bits for each of the L branches.

14. The method of claim 12 wherein in the robust mode the input packet is repeated L times.

15. The method of claim 14 wherein in K of the L branches the input packet is read from bit $N_0$ of the N bits in a wrap-around manner.

16. The method of claim 11 wherein flipping comprises reversing a bit order of one of the L sub-packets from end to beginning.

17. The method of claim 11 wherein interleaving comprises:
    writing the sub-packet row-by-row in a matrix having R rows and C columns; and
    reading the sub-packet from the matrix in a helical scan manner.

18. The method of claim 17 wherein C is equal to a product of number of symbols and number of carriers divided by a constant.

19. The method of claim 18 wherein R is equal to 10 and the constant is equal to 40.

20. The method of claim 11 wherein concatenating comprises concatenating the L sub-packets on a sub-packet basis.

21. A system comprising:
    a forward error correction (FEC) encoder to encode an input data stream, the FEC encoder comprising an interleaver to interleave an input packet from the input data stream, the interleaver comprising:
    a demultiplexer to demultiplex the input packet having N bits into L sub-packets on L branches;
    M flipping blocks coupled to the demultiplexer to flip M of the L sub-packets, M being smaller than L;
    L sub-interleaves coupled to the demultiplexer and the M flipping blocks to interleave the (L-M) sub-packets and the M flipped sub-packets; and
    a concatenate coupled to the L sub-interleaves to concatenate the interleaved sub-packets to form an output packet;
    a modulator coupled to the FEC encoder to modulate the output packet; and
    a power spectral density (PSD) shaping module coupled to the modulator to spectrally shape the modulated output packet; wherein L and M are integers greater than or equal to one.

22. The system of claim 21 wherein the modulator is an orthogonal frequency division multiplexing (OFDM) modulator.

\* \* \* \* \*

UNITED STATES PATENT AND TRADEMARK OFFICE
CERTIFICATE OF CORRECTION

PATENT NO. : 8,276,025 B2
APPLICATION NO. : 12/478679
DATED : September 25, 2012
INVENTOR(S) : Kaveh Razazian et al.

Page 1 of 1

It is certified that error appears in the above-identified patent and that said Letters Patent is hereby corrected as shown below:

In the Drawings:

Sheet 12 of 20, Reference
Numeral 1870, Fig. 18    Delete "MODE SELECTOR" and insert --MODE DETECTOR--

In the Specifications:

| | |
|---|---|
| Column 1, Line 65 | Delete "CENELC" and insert --CENELEC-- |
| Column 4, Line 2 | After "simple", insert --,-- |
| Column 4, Line 8 | After "stationary", insert --,-- |
| Column 4, Line 18 | Delete "bins" and insert --bits-- |
| Column 5, Line 19 | Delete "that", and insert --than-- |
| Column 5, Line 40 | Delete "NS" and insert --$N_s$-- |
| Column 5, Line 45 | Delete "NS" and insert --$N_s$-- |
| Column 5, Line 52 | Delete "CCRrate", insert --CCRate-- |
| Column 5, Line 53 | Delete "CCZerotail" and insert --CCZeroTail-- |
| Column 5, Line 67 | Delete "NS" and insert --$N_s$-- |
| Column 6, Line 17 | Delete "T-Frame" and insert --T_Frame-- |
| Column 7, Line 17 | Delete "CENELC" and insert --CENELEC-- |
| Column 7, Line 31 | Delete "simplifies", insert --simplify-- |
| Column 9, Line 23 | Delete "BFEC", insert --FEC-- |
| Column 10, Line 40 | After "times", insert --.-- |
| Column 10, Line 50 | After "820", delete "may be" |
| Column 11, Line 1 | After "Polynomial", insert --:-- |
| Column 12, Line 6 | Delete "inverse" and insert --Inverse-- |
| Column 12, Line 38 | Before "illustrated", delete "been" |
| Column 14, Line 33 | After "carrier", insert --index-- |
| Column 20, Line 34 | After "32", insert --]-- |
| Column 20, Line 36 | Delete "etc,", insert --etc.-- |
| Column 20, Line 41 | After "array", insert --.-- |

Signed and Sealed this
Third Day of September, 2013

Teresa Stanek Rea
*Acting Director of the United States Patent and Trademark Office*